US010430541B2

(12) United States Patent
Ke et al.

(10) Patent No.: US 10,430,541 B2
(45) Date of Patent: Oct. 1, 2019

(54) ALWAYS-ON TIE CELLS FOR LOW POWER DESIGNS AND METHOD OF MANUFACTURE THEREOF

(71) Applicant: Synopsys, Inc., Mountain View, CA (US)

(72) Inventors: Xianming Ke, Shanghai (CN); Fang Mao, Shanghai (CN); Wenwu Li, Shanghai (CN); Ashim Gupta, Fremont, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/599,340

(22) Filed: May 18, 2017

(65) Prior Publication Data
US 2017/0337315 A1    Nov. 23, 2017

Related U.S. Application Data

(60) Provisional application No. 62/338,454, filed on May 18, 2016, provisional application No. 62/400,084, filed on Sep. 26, 2016.

(51) Int. Cl.
G06F 17/50       (2006.01)
H03K 19/0948    (2006.01)
H03K 19/003     (2006.01)

(52) U.S. Cl.
CPC ... *G06F 17/5054* (2013.01); *H03K 19/00315* (2013.01); *H03K 19/0948* (2013.01)

(58) Field of Classification Search
CPC ....... H01L 2924/00; H01L 2224/73265; H01L 2224/48227; H01L 2224/32225; H01L 2924/14; H01L 2924/1306; H01L 2924/13091; H01L 27/0207; H01L 2924/1433; H01L 27/115; H01L 27/11807; H01L 23/528; H01L 29/7881; H01L 23/5226; H01L 27/11898; H01L 29/66545; G06F 17/5045; G06F 17/505; G06F 17/5072; G06F 17/5068; G06F 15/7867
USPC ...................... 326/62–81; 327/333
See application file for complete search history.

(56) References Cited

U.S. PATENT DOCUMENTS

| | | | |
|---|---|---|---|
| 7,334,207 B2* | 2/2008 | Preuthen ............. | H01L 27/0251 716/119 |
| 2006/0048079 A1* | 3/2006 | Dirks .................. | G06F 17/5045 716/120 |
| 2009/0249273 A1* | 10/2009 | Tsai ..................... | G06F 17/5068 716/119 |
| 2009/0278584 A1* | 11/2009 | Acharya ................ | H03K 19/20 327/309 |
| 2011/0260318 A1* | 10/2011 | Eisenstadt ........... | G06F 17/5054 257/737 |
| 2016/0111424 A1* | 4/2016 | Jayapal ............... | H01L 27/0921 257/372 |

* cited by examiner

*Primary Examiner* — Seokjin Kim
(74) *Attorney, Agent, or Firm* — Alston & Bird LLP

(57) ABSTRACT

Always-on (AO) tie cells, whose power supply has to remain on when the primary supply to the power domain is off, are used to implement logic constants. In accordance with embodiments of the present disclosure, insulated and non-insulated AO tie cells improve the QoR of the layout design and lower the power consumption.

28 Claims, 21 Drawing Sheets

US 10,430,541 B2

ALWAYS-ON TIE CELLS FOR LOW POWER DESIGNS AND METHOD OF MANUFACTURE THEREOF

CROSS-REFERENCE TO RELATED APPLICATIONS

The present application claims the benefit of priority to U.S. Provisional Application Ser. No. 62/400,084, titled "ALWAYS-ON TIE CELLS FOR LOW POWER DESIGN," filed Sep. 26, 2016, and U.S. Provisional Application Ser. No. 62/338,454, titled "ALWAYS-ON TIE CELLS FOR LOW POWER DESIGN," filed May 18, 2016, the contents of which are hereby incorporated by reference herein in their entirety.

FIELD

The present disclosure relates generally to place and route techniques and, more particularly, to always-on (AO) tie cells for low power integrated circuit (IC) designs.

BACKGROUND

In integrated circuit (IC) designs, nodes need to have logic constants at times. Nearly all digital circuits use a consistent logic level for all internal signals. That level, however, varies from one system to another. Interconnecting any two logic families often required special techniques such as additional pull-up resistors or purpose-built interface circuits known as level shifters. A level shifter connects one digital circuit that uses one logic level to another digital circuit that uses another logic level.

Isolation cells are used to prevent short circuit current. As the name suggests, these cells isolate a power gated block from the normally-on block. Isolation cells are specially designed for low short circuit current when input is at threshold voltage level. Isolation control signals are provided by the power gating controller. Isolation of the signals of a switchable module is essential to preserve design integrity. Usually a simple OR or AND logic can function as an output isolation device.

Instead of directly connecting a node requiring constant logic to VDD or VSS, which can have reliability implications (e.g., gate oxide damage), tie cells are used. Tie cells are components that can implement logic constants, i.e. '1' (or VDD) and '0' (or VSS). As shown in FIG. 1, there are two tie cells 110, 120 in a standard cell area. A tie cell 110 shown at left in FIG. 1 is a tie high cell (output at Y 130 is VDD 140) and the right tie cell 120 is a tie low cell (output at Y 150 is VSS 160). As a standard cell, a tie cell can reuse PG stripes (power and ground stripes) to save on routing resources.

However, new violations are introduced when only these tie cells are used to implement constant logic, and the design requires extra cells to fix the violations. As an example of such violations, in FIG. 2, the related supply of the load pin 220 of a macro 210 is supply VDD108AO 230. Supply VDD108AO 230, in this example, has the same voltage as primary supply VDD108SD 240, but macro 210 has a different power on/off state requirement as compared to the primary supply 240. If a tie cell 250 according to the design shown in FIG. 1 is used for constant logic implementation, an additional isolation cell (ISO) 260 is needed in to resolve the voltage or power state difference between the tie cell 250 and the load pin 220 of the macro 210.

It will be appreciated that, as used herein, the term macro refers to a macrocell array, which is an approach to the design and manufacture of ASICs. A macrocell array is a small step up from the otherwise similar gate array, but rather than being a prefabricated array of simple logic gates, the macrocell array is a prefabricated array of higher-level logic functions such as flip-flops, ALU functions, registers, and the like.

As another example, in FIG. 3, the voltage of the load supply voltage VDD108AO 330 is different than that of the primary supply VDD90AO 340. If a tie cell 350 according to the design shown in FIG. 1 is used for constant logic implementation, an additional level shifter cell (LS) 360 is needed to adjust for the voltage or power state difference between the tie cell 350 and the load pin 320 of the macro 310.

SUMMARY

An embodiment of the present disclosure provides an integrated circuit system, including: a non-insulated always-on (AO) tie-high cell, comprising a p-type transistor formed in an N-well; an n-type transistor formed in a P-well; and an always-on backup power supply (VDD_AO) connected to the p-type transistor such that an output of the AO tie cell remains logic high ("1") when a primary power supply (VDD) is off, wherein the always-on backup power supply (VDD_AO) has a voltage level that matches a voltage level of the primary power supply (VDD).

An embodiment of the present disclosure provides an integrated circuit system, including: a non-insulated always-on (AO) tie-high cell, comprising a p-type transistor formed in an N-well; an n-type transistor formed in a P-well; and an always-on backup ground supply (VSS_AO) connected to the n-type transistor such that an output of the AO tie cell remains logic high ("1") when a primary ground supply (VSS) is off.

An embodiment of the present disclosure provides an integrated circuit system, including: a non-insulated always-on (AO) tie-high cell, comprising a p-type transistor formed in an N-well; an n-type transistor formed in a P-well; and an always-on backup power supply (VDD_AO) connected to the p-type transistor and an always-on backup ground supply (VSS_AO) connected to the n-type transistor such that an output of the AO tie cell remains logic high ("1") when either of VDD and VSS is off, wherein the always-on backup power supply (VDD_AO) has a voltage level that matches a voltage level of the primary power supply (VDD).

An embodiment of the present disclosure provides an integrated circuit system, including: an insulated always-on (AO) tie-high cell, comprising a p-type transistor formed in an insulated N-well, wherein the insulated N-well is isolated from other N-wells; a routing connection (BIASNW) connecting back bias pins of the other N-wells; an n-type transistor formed in a P-well; and an insulated backup power supply (VDDI) connected to the p-type transistor such that an output of the AO tie cell remains logic high ("1") when a primary power supply (VDD) is off, where in the insulated backup power supply (VDDI) has a different voltage level than a voltage level of the primary power supply (VDD).

An embodiment of the present disclosure provides an integrated circuit system, including: an insulated always-on (AO) tie-high cell, comprising a p-type transistor formed in an insulated N-well, wherein the insulated N-well is isolated from other N-wells; a routing connection (BIASNW) connecting back bias pins of the other N-wells; an n-type transistor formed in a P-well; and an insulated backup power supply (VDDI) connected to the p-type transistor and an always-on backup ground supply (VSS_AO) connected to the n-type transistor such that an output of the AO tie cell remains logic high ("1") when either of VDD and VSS is off, wherein the insulated backup power supply (VDDI) has a different voltage level than a voltage level of the primary power supply (VDD).

An embodiment of the present disclosure provides an integrated circuit system, including: a non-insulated always-on (AO) tie-low cell, comprising a p-type transistor formed in an N-well; an n-type transistor formed in a P-well; and an always-on backup power supply (VDD_AO) connected to the p-type transistor such that an output of the AO tie cell remains logic low ("0") when a primary supply (VDD) is off, wherein the always-on backup power supply (VDD_AO) has a voltage level that matches a voltage level of the primary power supply (VDD).

An embodiment of the present disclosure provides an integrated circuit system, including: a non-insulated always-on (AO) tie-low cell, comprising a p-type transistor formed in an N-well; an n-type transistor formed in a P-well; and an always-on backup ground supply (VSS_AO) connected to the n-type transistor such that an output of the AO tie cell remains logic low ("0") when a primary ground supply (VSS) is off.

An embodiment of the present disclosure provides an integrated circuit system, including: a non-insulated always-on (AO) tie-low cell, comprising a p-type transistor formed in an N-well; an n-type transistor formed in a P-well; and an always-on backup power supply (VDD_AO) connected to the p-type transistor and an always-on backup ground supply (VSS_AO) connected to the n-type transistor such that an output of the AO tie cell remains logic low ("0") when either of VDD and VSS is off, where in the always-on backup power supply (VDD_AO) has a voltage level that matches a voltage level of the primary power supply (VDD).

An embodiment of the present disclosure provides an integrated circuit system, including: an insulated always-on (AO) tie-low cell, comprising a p-type transistor formed in an insulated N-well, wherein the insulated N-well is isolated from other N-wells; a routing connection connecting back bias pins of the other N-wells; an n-type transistor formed in a P-well; and an insulated backup power supply (VDDI) connected to the p-type transistor such that an output of the AO tie cell remains logic low ("0") when a primary power supply (VDD) is off, where in the insulated backup power supply (VDDI) has a different voltage level than a voltage level of the primary power supply (VDD).

An embodiment of the present disclosure provides an integrated circuit system, including: an insulated always-on (AO) tie-low cell, comprising a p-type transistor formed in an insulated N-well, wherein the insulated N-well is isolated from other N-wells; a routing connection connecting back bias pins of the other N-wells; an n-type transistor formed in a P-well; and an insulated backup power supply (VDDI) connected to the p-type transistor and an always-on backup ground supply (VSS_AO) connected to the n-type transistor such that an output of the AO tie cell remains logic low ("0") when either of VDD and VSS is off, wherein the insulated backup power supply (VDDI) has a different voltage level than a voltage level of the primary power supply (VDD).

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
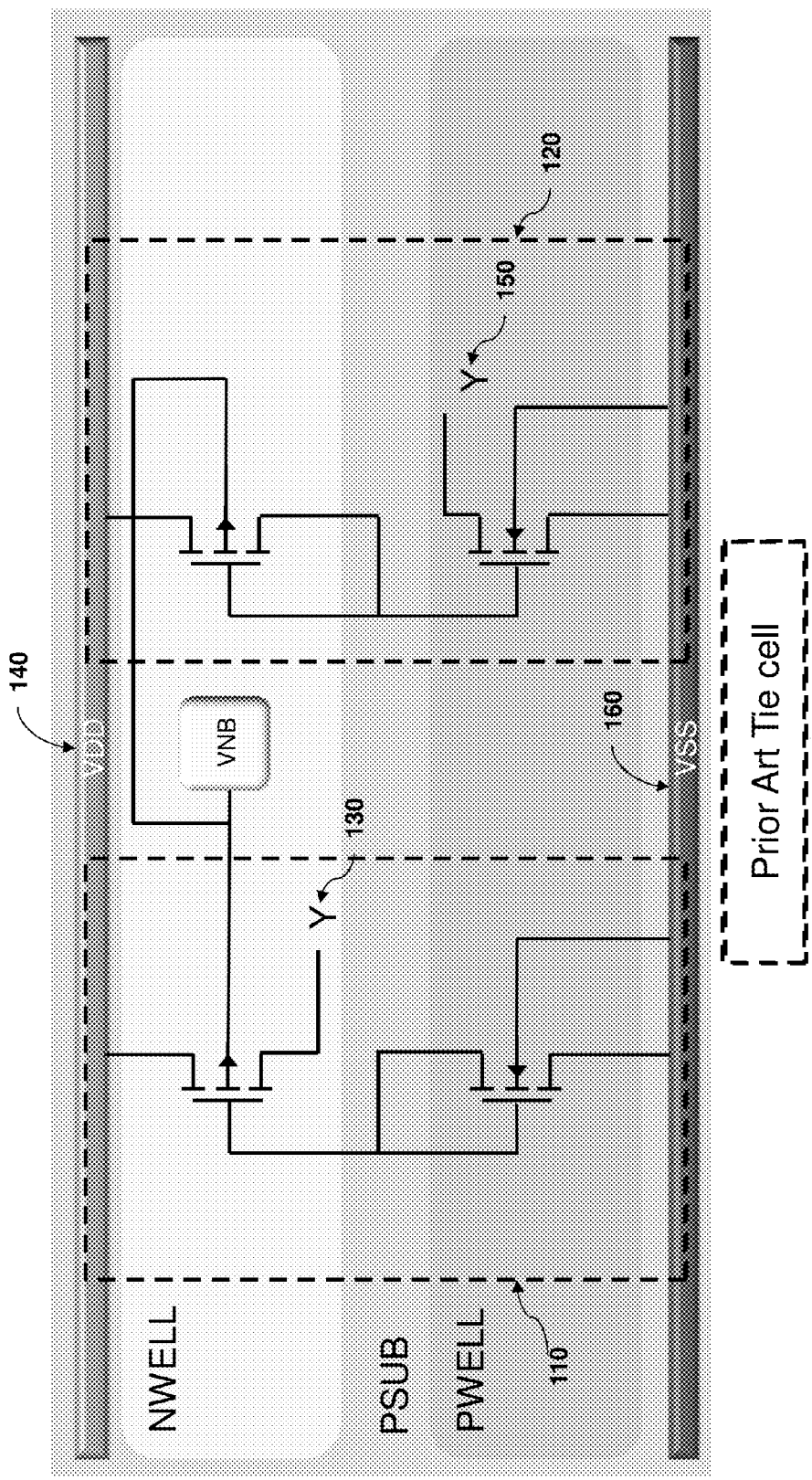
FIG. 1 illustrates a cell area comprising two prior art tie cells.

The following embodiments are described in sufficient detail to enable those skilled in the art to make and use embodiments of the present disclosure. It is understood that other embodiments would be evident based on the present disclosure, and that system, process, or changes may be made without departing from the scope of the present invention.

In the following description, numerous specific details are given to provide a thorough understanding of the invention. However, it will be apparent that the invention may be practiced without these specific details. In order to increase clarity, some well-known circuits, system configurations, and process steps may not be described in detail.

The drawings showing embodiments of the system are semi-diagrammatic and not to scale and, particularly, some of the dimensions are for the clarity of presentation and are shown exaggerated in the drawing Figures.

According to embodiments of the present disclosure, an always-on (AO) tie cell is tie cell comprising backup power pins for use in keeping the AO tie cell powered on (or at a logic high or '1') when its own power domain's primary power supply is off.

It will be appreciated that a backup power supply as described herein may have a higher level connection to a primary power supply than is depicted in the figures herein, however, at the AO tie-cell design level depicted in the figures herein, there is not a necessary direct relationship between the primary power supply and the backup power supply. It will be further appreciated that an IC design depicted herein may have multiple voltage and/or power supplies (the terms used interchangeably herein).

Figure 4A:
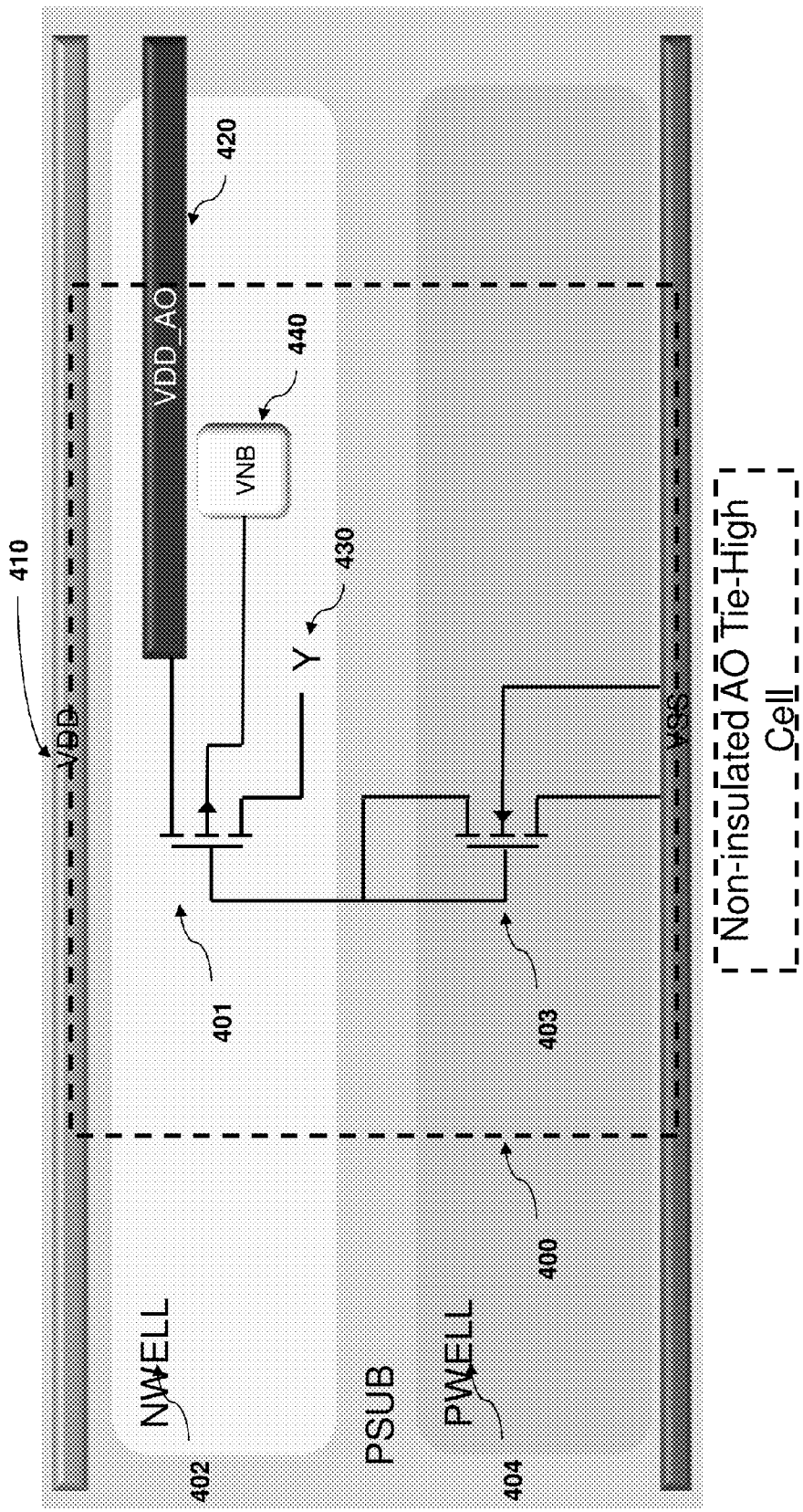
FIG. 4A illustrates an exemplary non-insulated AO tie-high cell, according to embodiments of the present disclosure.

FIG. 4A is a schematic diagram of an AO tie-high cell 400, in accordance with one embodiment of the present disclosure. The AO tie-high cell 400 comprises a p-type transistor 401 formed in an N-well 402 and an n-type transistor 403 formed in a P-well 404. As shown in FIG. 4A, the primary supply VDD 410 is a dummy PG stripe for the AO tie cell 400 and the backup supply VDD_AO 420 is the real power net for the cell 400. VDD_AO 420 stays on longer than primary supply VDD 410, so when VDD 410 is off, the output Y 430 of AO tie cell 400 can still output logic '1'.

The backup supply, VDD_AO 420, of the AO tie-high cell 400 in FIG. 4A is at the same voltage level as primary supply VDD 410. The back bias pin VNB 440 can have the same connection as a normal tie cell. This type of AO tie cell is referred to herein as a non-insulated AO tie-high cell 400.

Figure 4B:
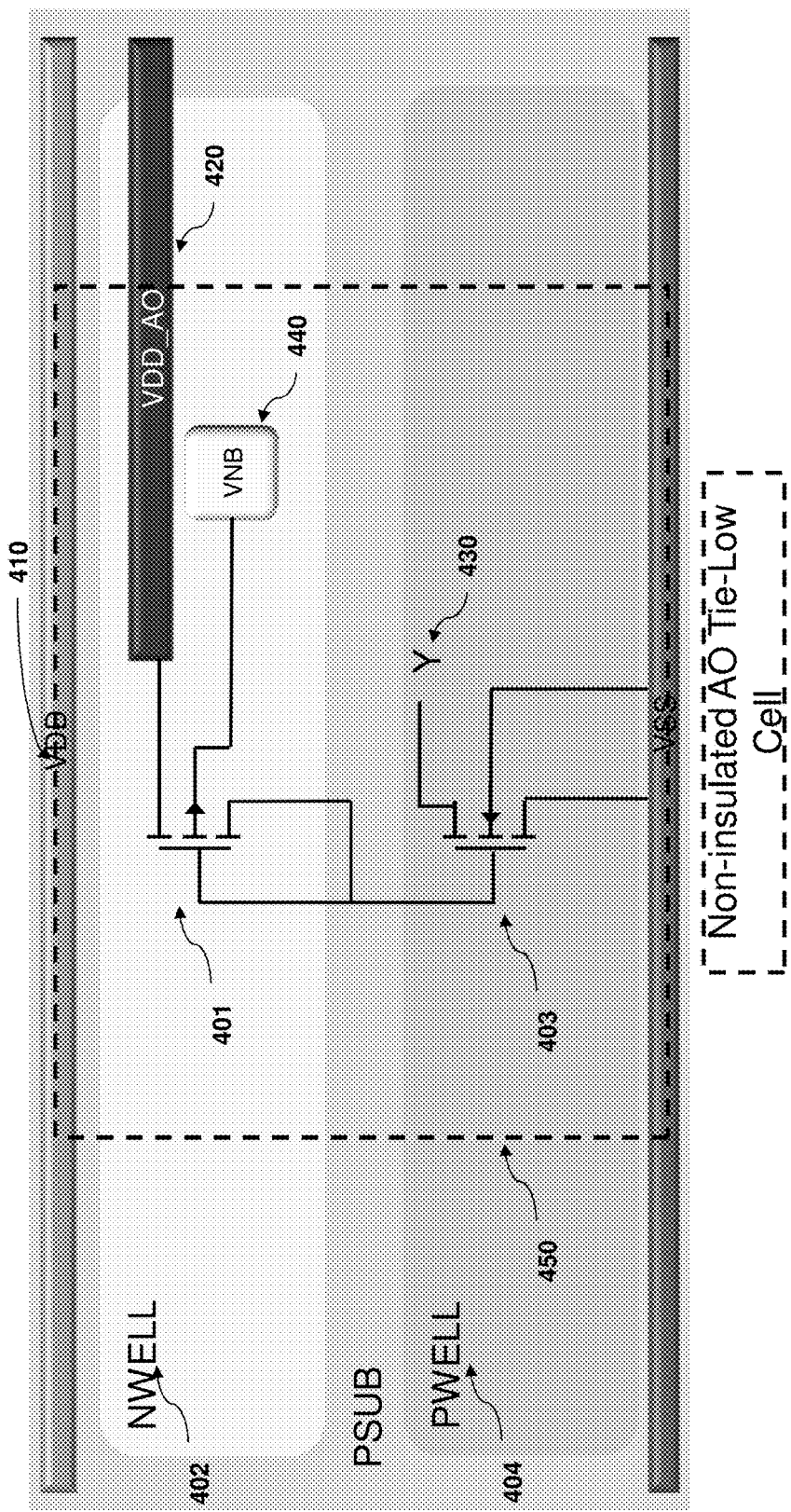
FIG. 4B illustrates an exemplary non-insulated AO tie-low cell, according to embodiments of the present disclosure.

FIG. 4B is a schematic diagram of an AO tie-low cell 450, in accordance with one embodiment of the present disclosure. The AO tie-low cell 450 comprises a p-type transistor 401 formed in an N-well 402 and an n-type transistor 403 formed in a P-well 404. As shown in FIG. 4B, the primary supply VDD 410 is a dummy PG stripe for the AO tie-low cell 450 and the backup supply VDD_AO 420 is the real power net for the cell AO tie-low cell 450. VDD_AO 420 stays on longer than primary supply VDD 410, so when VDD 410 is off, the output Y 430 of AO tie-low cell 450 can still output logic '0'.

The backup supply, VDD_AO 420, of the AO tie-low cell 450 in FIG. 4B is at the same voltage level as primary supply VDD 410. The back bias pin VNB 440 can have the same connection as a normal tie cell. This type of AO tie cell is referred to herein as a non-insulated AO tie-low cell 450.

Figure 5A:
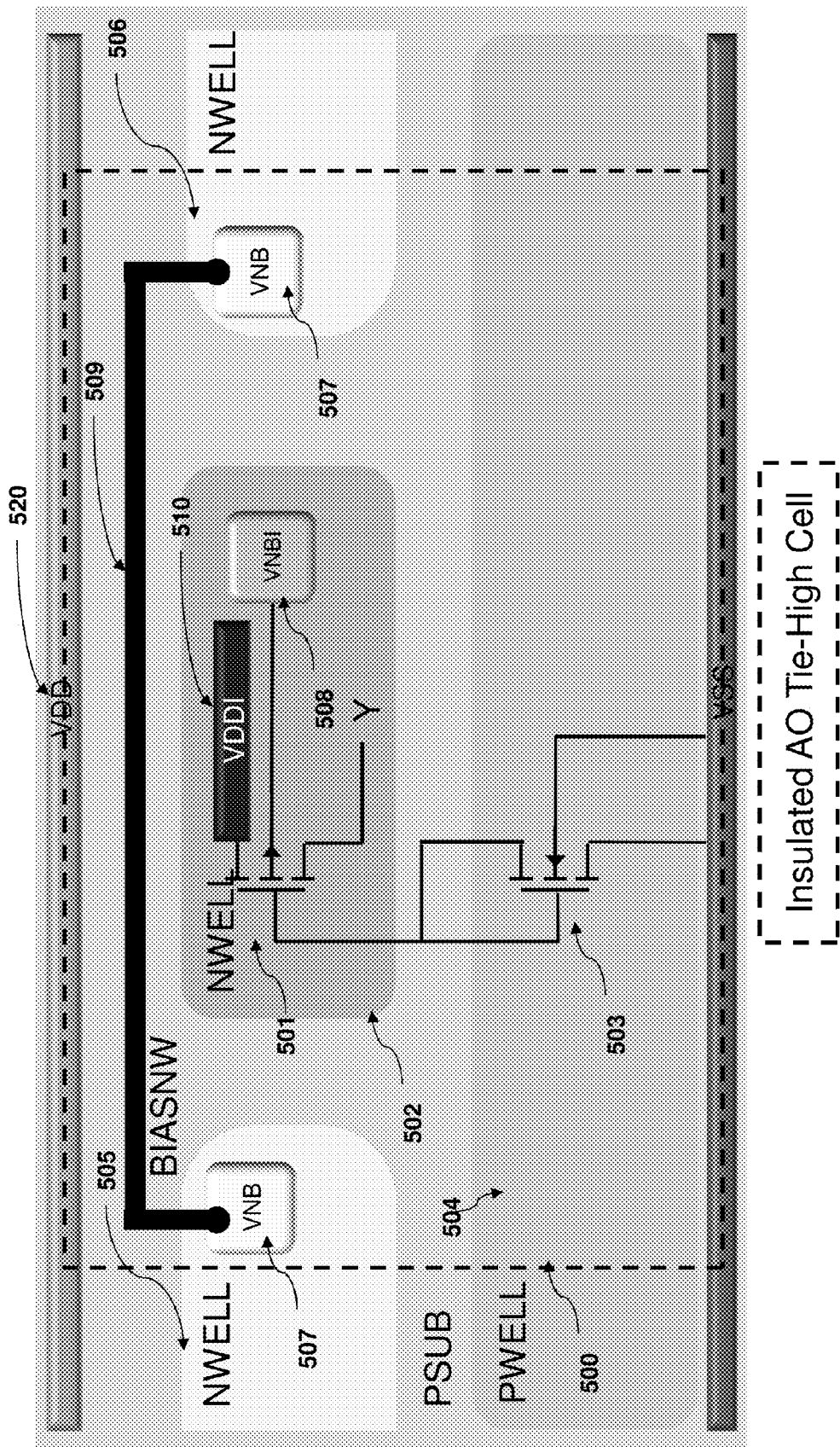
FIG. 5A illustrates an exemplary insulated AO tie-high cell, according to embodiments of the present disclosure.

FIG. 5A is a schematic diagram of an insulated AO tie-high cell 500, in accordance with another embodiment of the present disclosure. The insulated AO tie-high cell 500 comprises a p-type transistor 501 formed in an isolated N-well 502 and an n-type transistor 503 formed in a P-well 504. With insulated bias well support, a backup supply VDDI 510 can be at a different voltage level than primary supply VDD 520.

Isolated N-well 502 is isolated from other N-wells 505, 506. Accordingly, bias supply VNB 507 has no impact on the shutdown and timing behavior of the signal pin to which VNBI 508 relates. BIASNW 509 is a routing connection to maintain well continuity for the rest of the standard cells in the row and is connected to the domain N-well supply. The backup supply VDDI 510 connected to the insulated N-well 502 can have different a voltage level than primary supply VDD 520. This type of AO tie cell is referred to herein as an insulated AO tie-high cell 500.

Figure 5B:
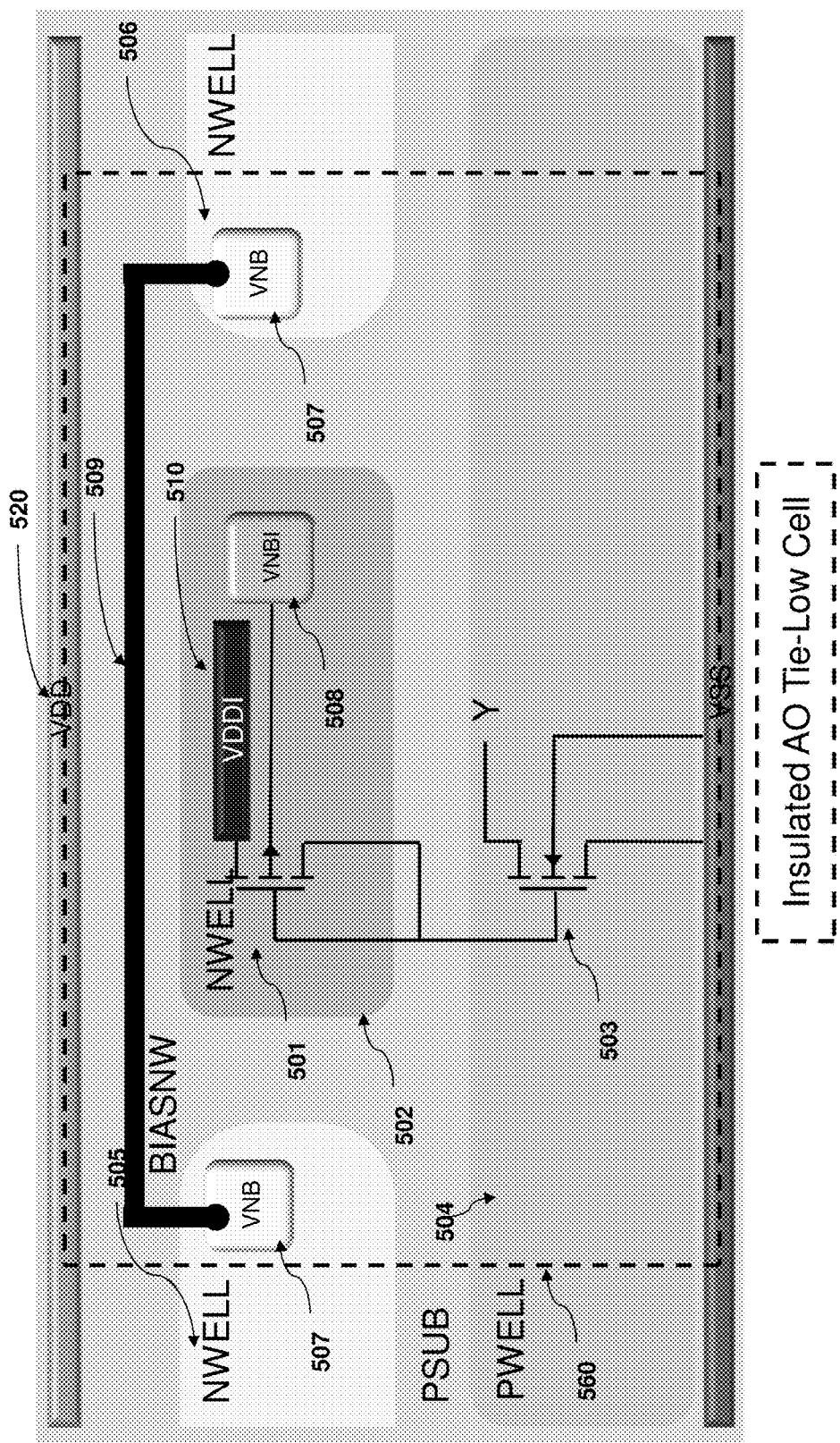
FIG. 5B illustrates an exemplary insulated AO tie-low cell, according to embodiments of the present disclosure.

FIG. 5B is a schematic diagram of an insulated AO tie-low cell 560, in accordance with another embodiment of the present disclosure. The insulated AO tie-low cell 560 comprises a p-type transistor 501 formed in an isolated N-well 502 and an n-type transistor 503 formed in a P-well 504. With insulated bias well support, a backup supply VDDI 510 can be at a different voltage level than primary supply VDD 520.

Isolated N-well 502 is isolated from other N-wells 505, 506. Accordingly, bias supply VNB 507 has no impact on the shutdown and timing behavior of the signal pin to which VNBI 508 relates. BIASNW 509 is a routing connection to maintain well continuity for the rest of the standard cells in the row and is connected to the domain N-well supply. The backup supply VDDI 510 connected to the insulated N-well can have different a voltage level than primary supply VDD 520. This type of AO tie cell is referred to herein as an insulated AO tie-low cell 560.

Figure 6:
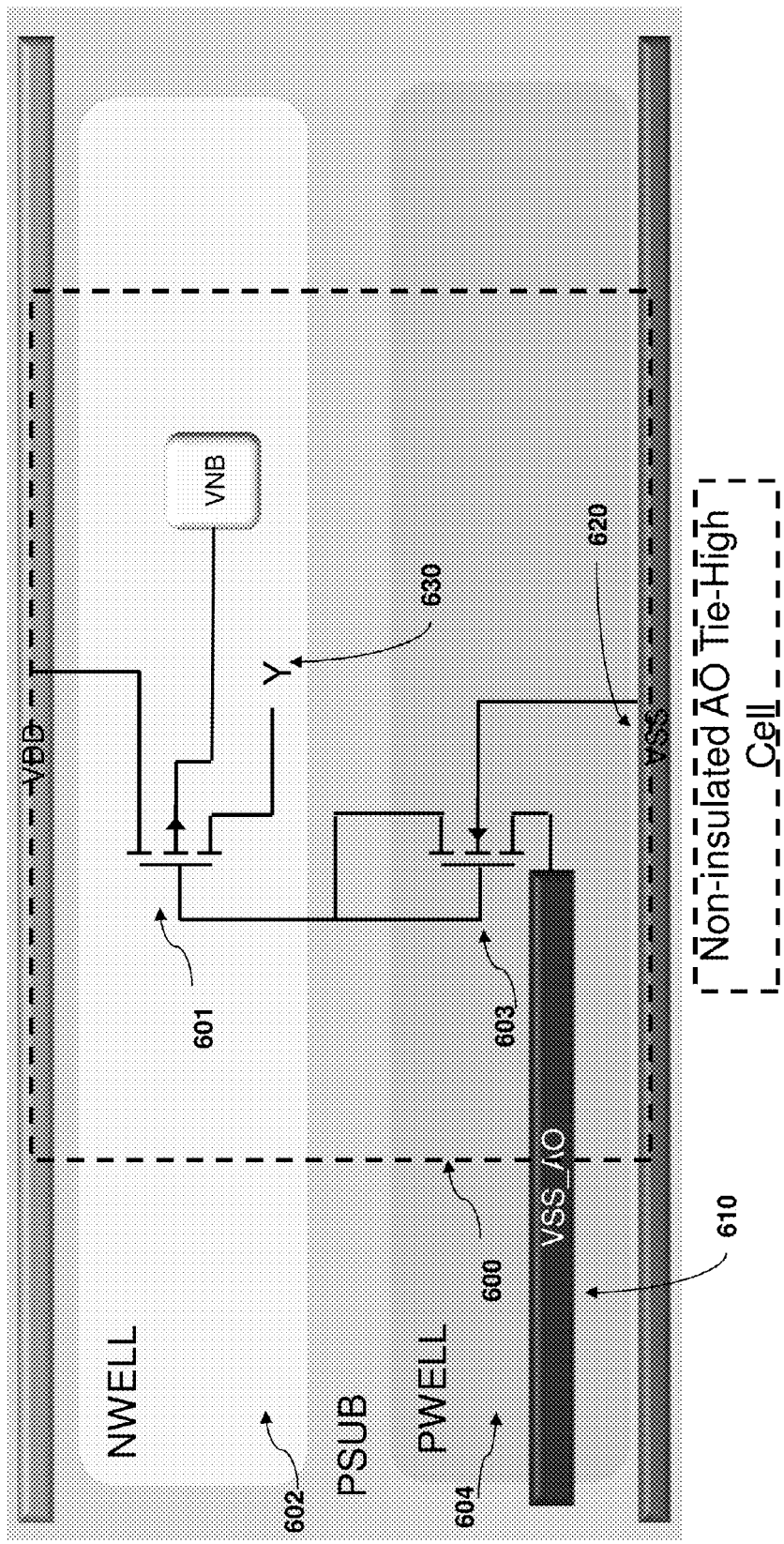
FIG. 6 illustrates an exemplary non-insulated AO tie-high cell, according to embodiments of the present disclosure.

FIG. 6 is a schematic diagram of a non-insulated AO tie-high cell 600, in accordance with another embodiment of the present disclosure. The AO tie-high cell 600 comprises a p-type transistor 601 formed in an N-well 602 and an n-type transistor 603 formed in a P-well 604. Non-insulated tie high cell 600 further comprises an always-on backup ground supply (VSS_AO 610) connected to the n-type transistor 603 such that an output Y 630 of the AO tie cell 600 remains logic high ("1") when a primary ground supply (VSS 620) is off.

Figure 7:
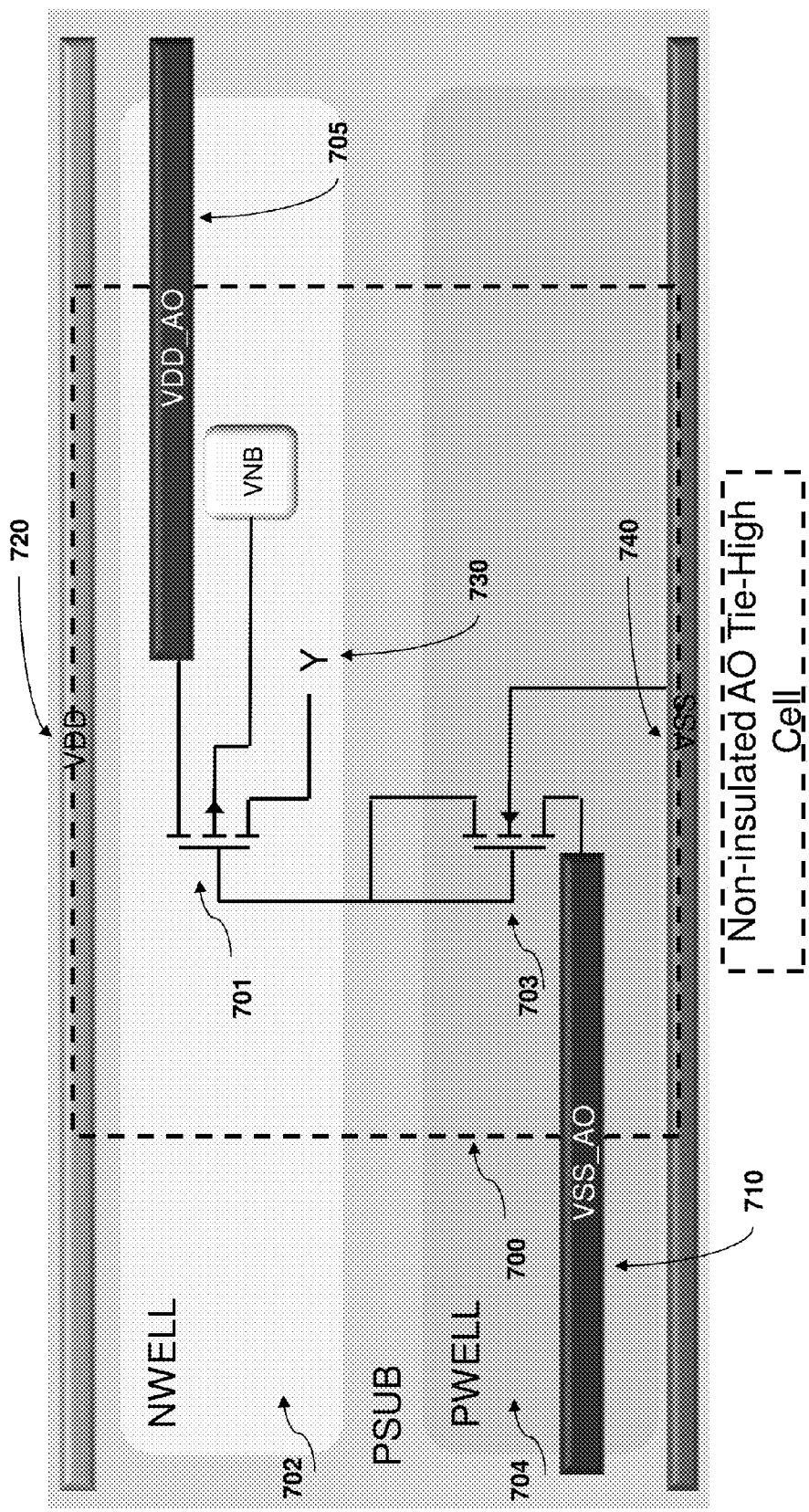
FIG. 7 illustrates an exemplary non-insulated AO tie-high cell, according to embodiments of the present disclosure.

FIG. 7 is a schematic diagram of a non-insulated AO tie-high cell 700, in accordance with another embodiment of the present disclosure. Non-insulated AO tie-high cell 700 has a p-type transistor 701 formed in an N-well 702 and an n-type transistor 703 formed in a P-well 704. Non-insulated tie-high cell 700 further comprises an always-on backup power supply (VDD_AO 705) connected to the p-type transistor 701 and an always-on backup ground supply (VSS_AO 710) connected to the n-type transistor 703 such that an output Y 730 of the AO tie cell 700 remains logic high ("1") when either of VDD 720 and VSS 740 is off. The always-on backup power supply (VDD_AO 705) has a voltage level that matches a voltage level of the primary power supply (VDD 720).

Figure 8:
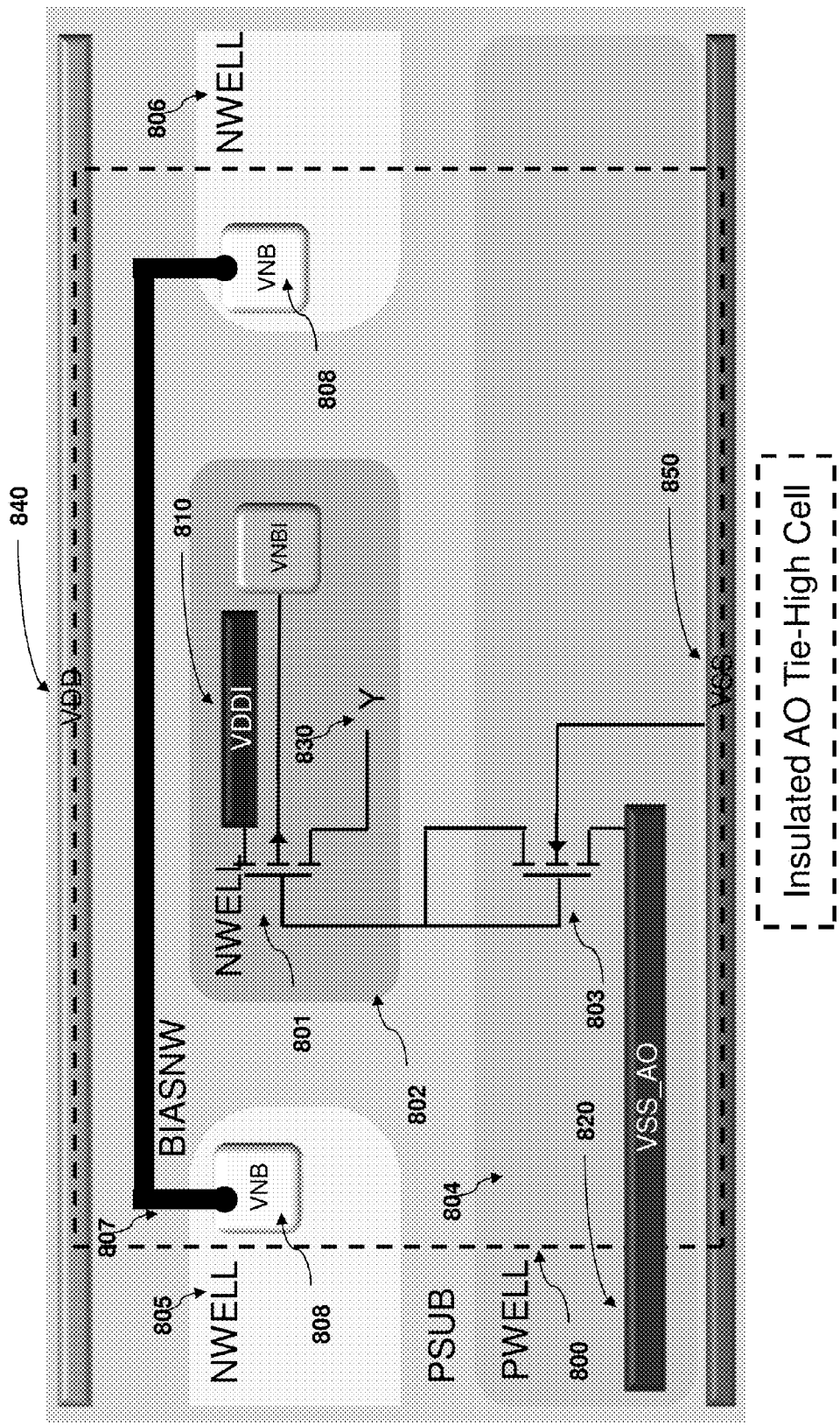
FIG. 8 illustrates an exemplary insulated AO tie-high cell, according to embodiments of the present disclosure.

FIG. 8 is a schematic diagram of an insulated AO tie-high cell 800, in accordance with another embodiment of the present disclosure. Insulated AO tie-high cell 800 has a p-type transistor 801 formed in an insulated N-well 802, where the insulated N-well 802 is isolated from other N-wells 805, 806. Insulated AO tie-high cell 800 further comprises a routing connection BIASNW 807 that connects back bias pins 808 of the other N-wells 805, 806. Insulated AO tie-high cell 800 further comprises an n-type transistor 803 formed in a P-well 804. An insulated backup power supply (VDDI 810) is connected to the p-type transistor 801 and an always-on backup ground supply (VSS_AO 820) is connected to the n-type transistor 803 such that an output Y 830 of the AO tie cell 800 remains logic high ("1") when either of VDD 840 and VSS 850 is off. The insulated backup power supply (VDDI 810) has a different voltage level than a voltage level of the primary power supply (VDD 840).

Figure 9:
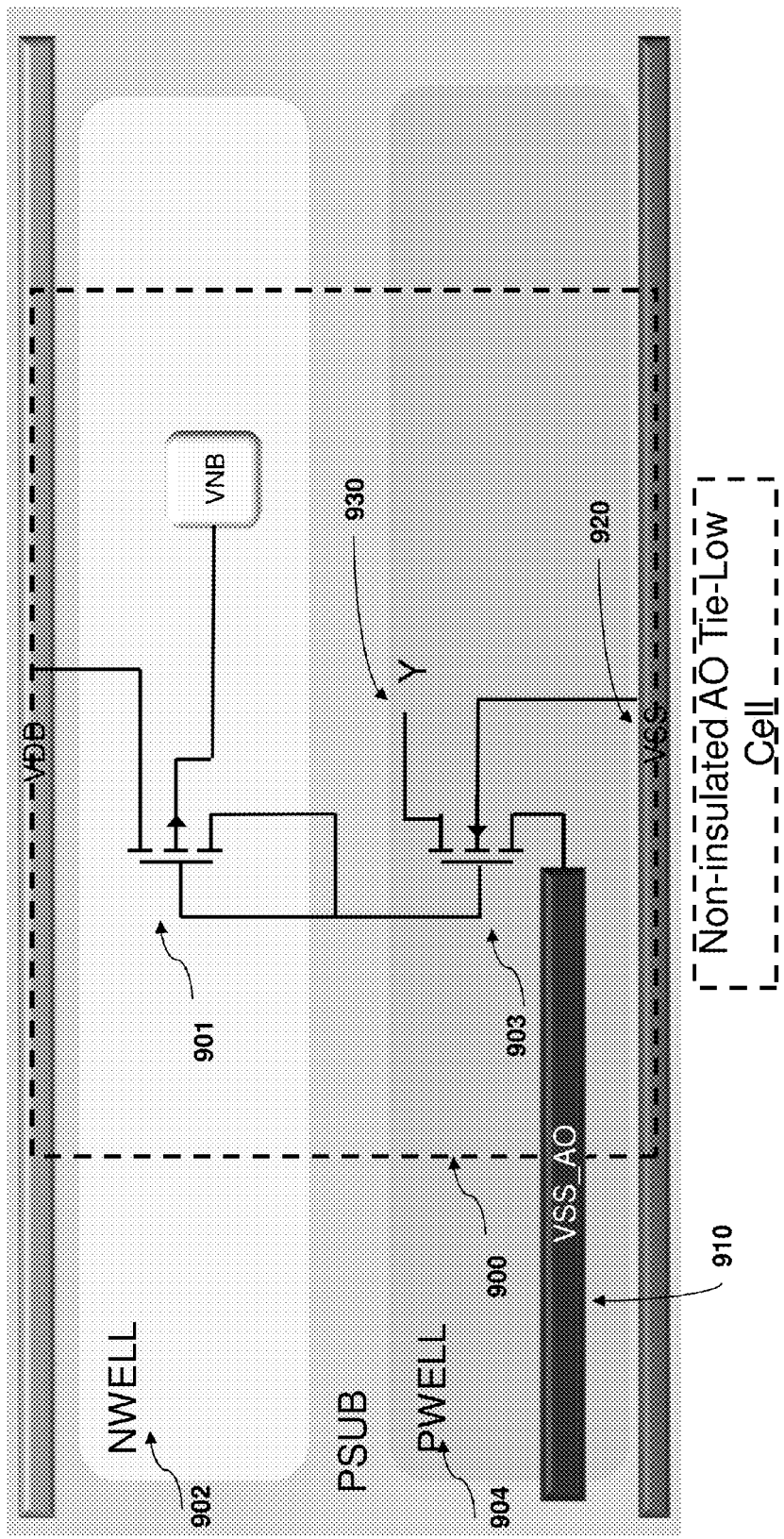
FIG. 9 illustrates an exemplary non-insulated AO tie-low cell, according to embodiments of the present disclosure.

FIG. 9 is a schematic diagram of a non-insulated AO tie-low cell 900, in accordance with another embodiment of the present disclosure. Non-insulated AO tie-low cell 900 comprises a p-type transistor 901 formed in an N-well 902 and an n-type transistor 903 formed in a P-well 904. Non-insulated AO tie-low cell 900 further comprises an always-on backup ground supply (VSS_AO 910) connected to the n-type transistor 903 such that an output Y 930 of the AO tie cell 900 remains logic low ("0") when a primary ground supply (VSS 920) is off.

Figure 10:
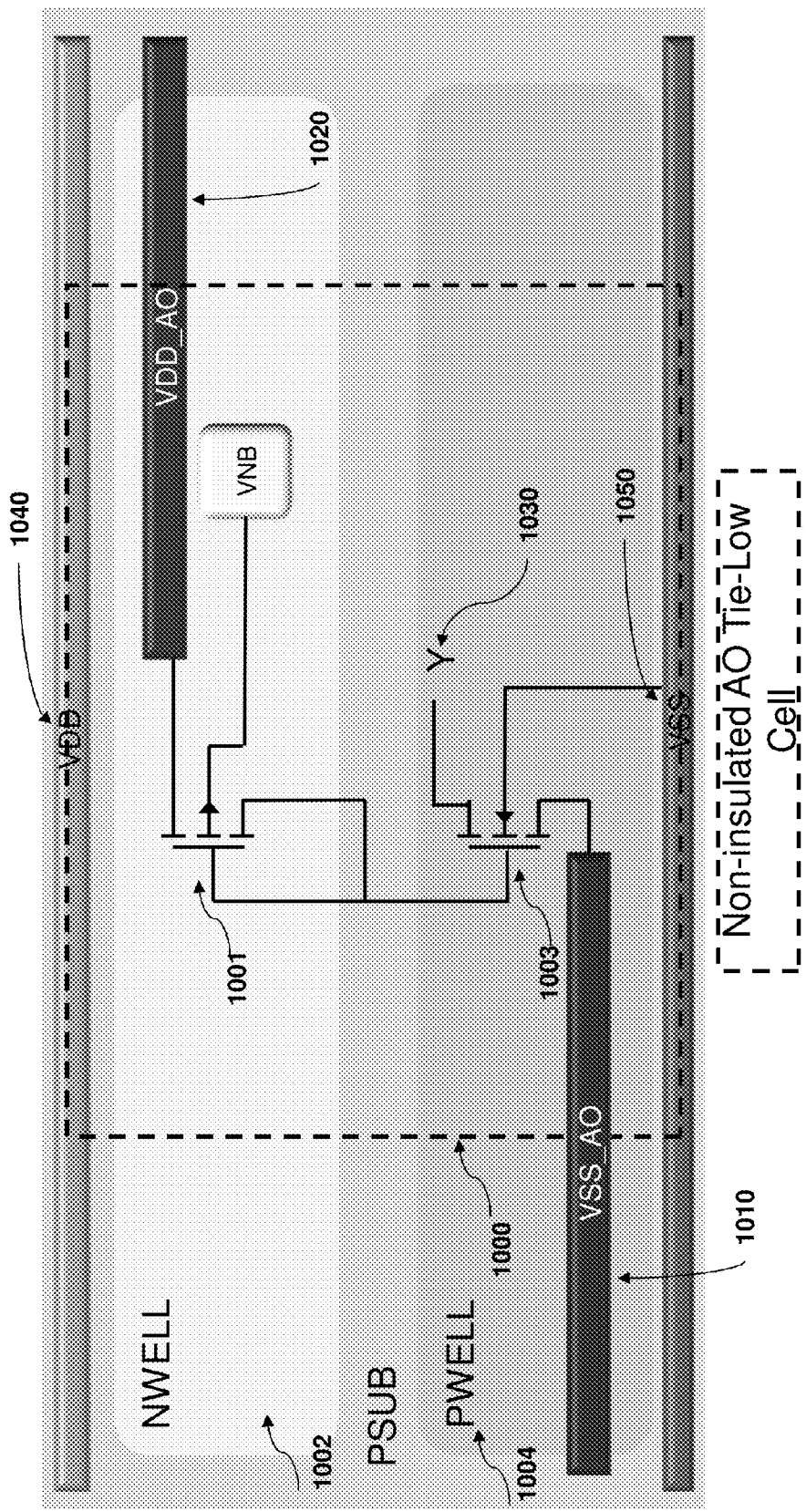
FIG. 10 illustrates an exemplary non-insulated AO tie-low cell, according to embodiments of the present disclosure.

FIG. 10 is a schematic diagram of a non-insulated always-on (AO) tie-low cell 1000, in accordance with another embodiment of the present disclosure. Non-insulated AO tie-low cell 1000 comprises a p-type transistor 1001 formed in an N-well 1002 and an n-type transistor 1003 formed in a P-well 1004. Non-insulated AO tie-low cell 1000 further comprises an always-on backup power supply (VDD_AO 1010) connected to the p-type transistor 1001 and an always-on backup ground supply (VSS_AO 1020) connected to the n-type transistor 1003 such that an output Y 1030 of the AO tie cell 1000 remains logic low ("0") when either of VDD 1040 and VSS 1050 is off. The always-on backup power supply (VDD_AO 1010) has a voltage level that matches a voltage level of the primary power supply (VDD 1040).

Figure 11:
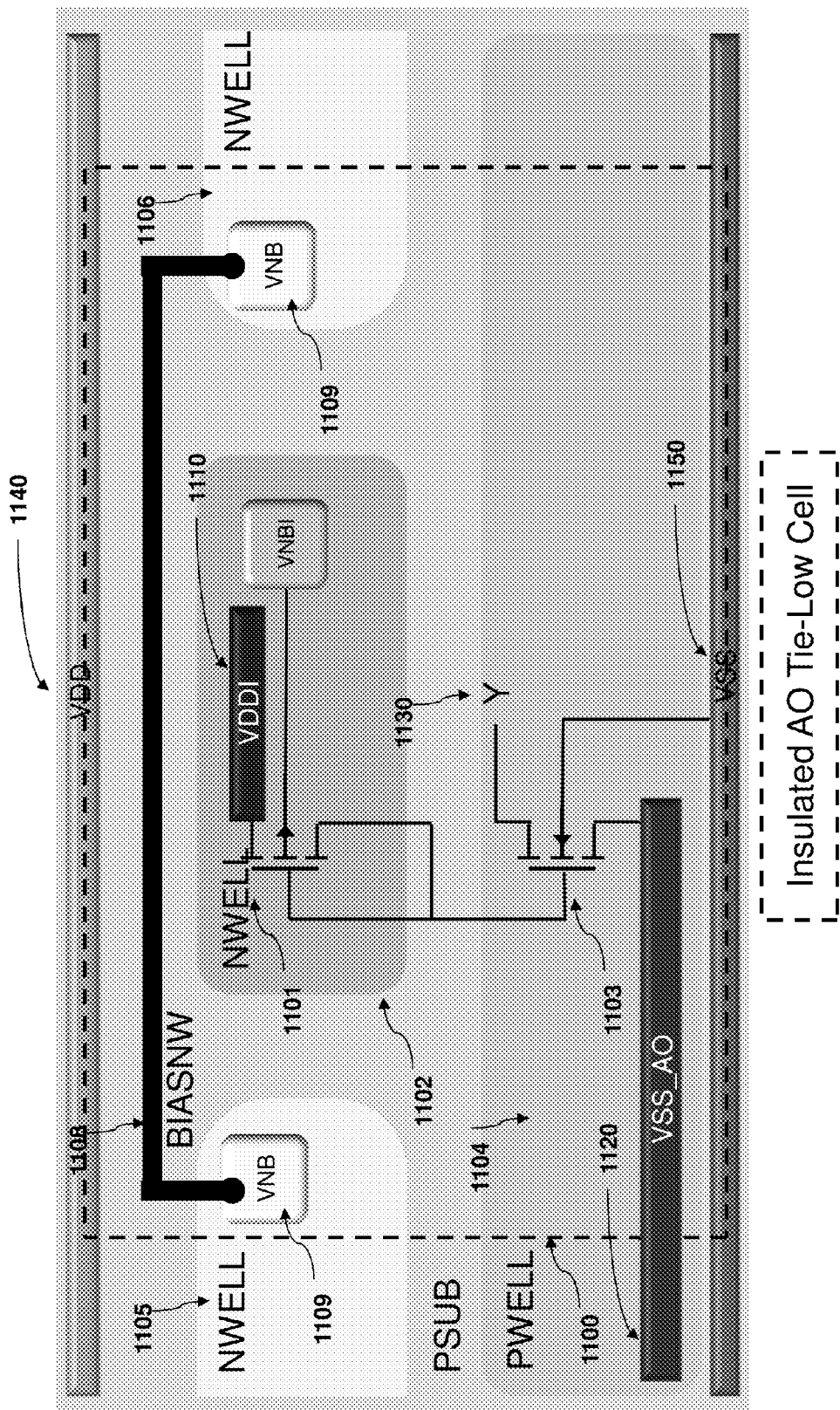
FIG. 11 illustrates an exemplary insulated AO tie-low cell, according to embodiments of the present disclosure.

FIG. 11 is a schematic diagram of an insulated always-on (AO) tie-low cell 1100, in accordance with another embodiment of the present disclosure. An insulated AO tie-low cell 1100 comprises a p-type transistor 1101 formed in an insulated N-well 1102, where the insulated N-well 1102 is isolated from other N-wells 1105, 1106. A routing connection BIASNW 1108 connects back bias pins 1109 of the other N-wells 1105, 1106. Insulated AO tie-low cell 1100 further comprises an n-type transistor 1103 formed in a P-well 1104. An insulated backup power supply (VDDI 1110) is connected to the p-type transistor 1101 and an always-on backup ground supply (VSS_AO 1120) is connected to the n-type transistor 1103 such that an output Y 1130 of the AO tie cell 1100 remains logic low ("0") when either of VDD 1140 and VSS 1150 is off. The insulated backup power supply (VDDI 1110) has a different voltage level than a voltage level of the primary power supply (VDD 1140).

Figure 2:
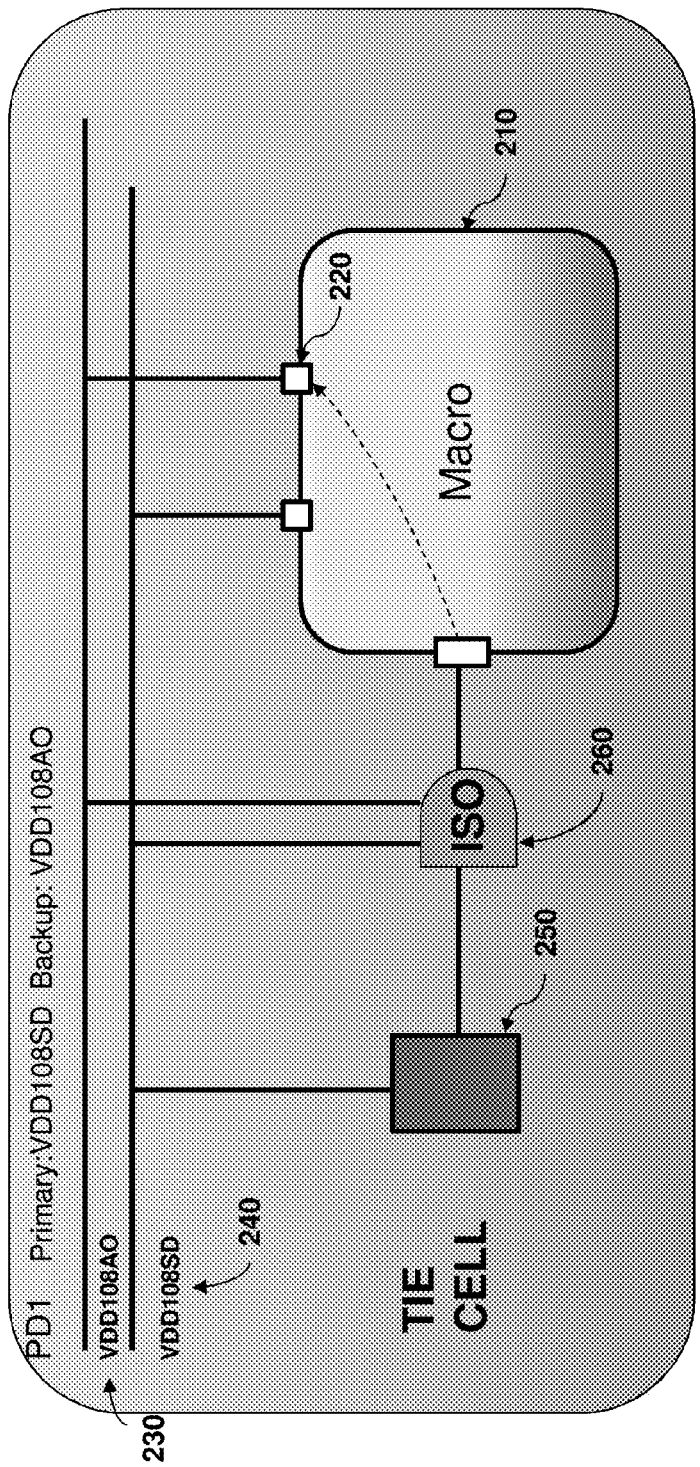
FIG. 2 illustrates a design comprising a macro and a prior art tie cell.
Figure 12:
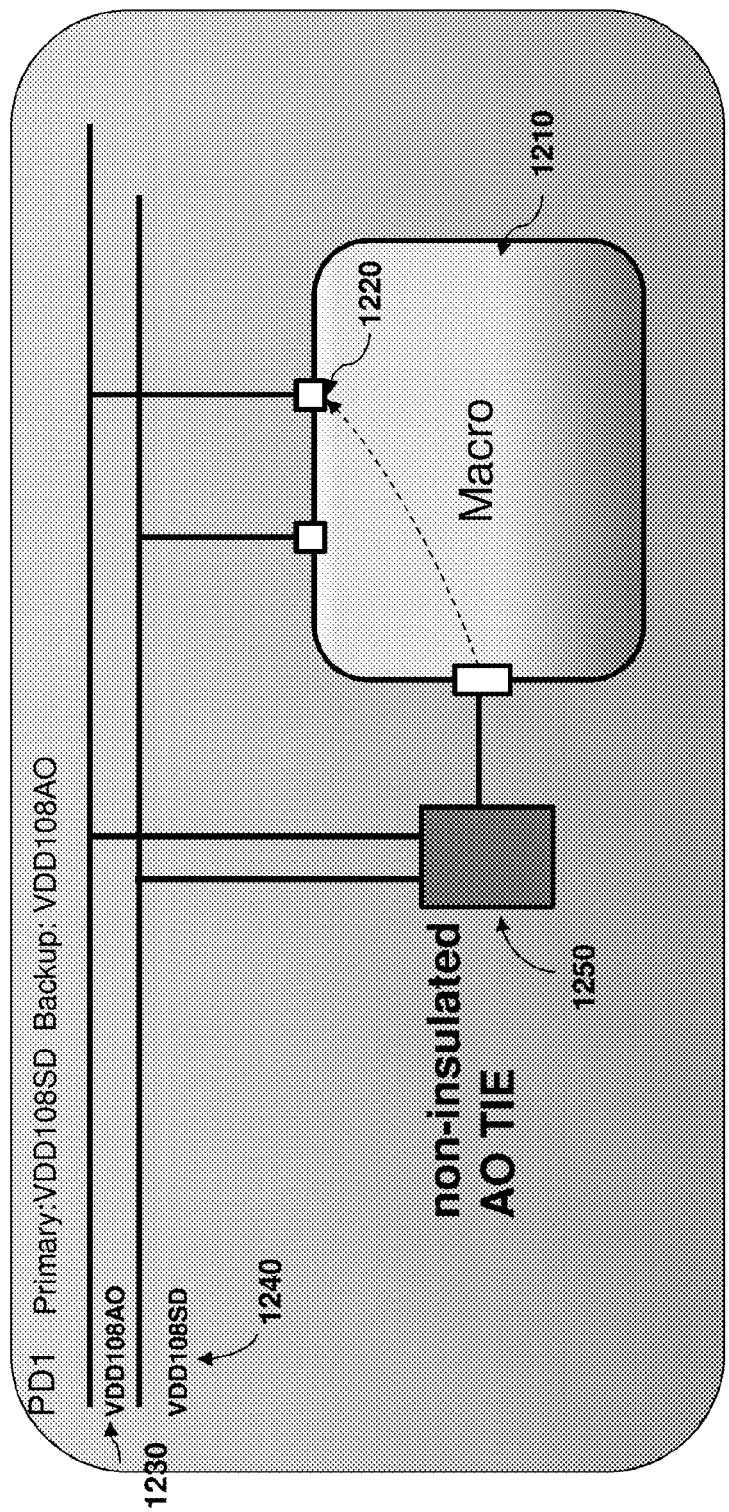
FIG. 12 illustrates an exemplary design using an exemplary non-insulated AO tie cell, according to embodiments of the present disclosure.

FIG. 12 illustrates the case in which the load supply voltage 1230 (VDD108AO) is at the same level as the primary supply voltage 1240 (VDD108SD) but the macro 1210 has a different power state requirement. Accordingly, a non-insulated AO tie cell 1250 is used without the need for additional isolation requirements to resolve the power state difference between pin 1220 of the macro 1210 and the non-insulated AO tie cell 1250. It will be appreciated that this is in contrast to the depiction in FIG. 2 (wherein an additional ISO cell is required to resolve the power state difference between a pin of the macro and the normal or prior art tie cell).

Figure 3:
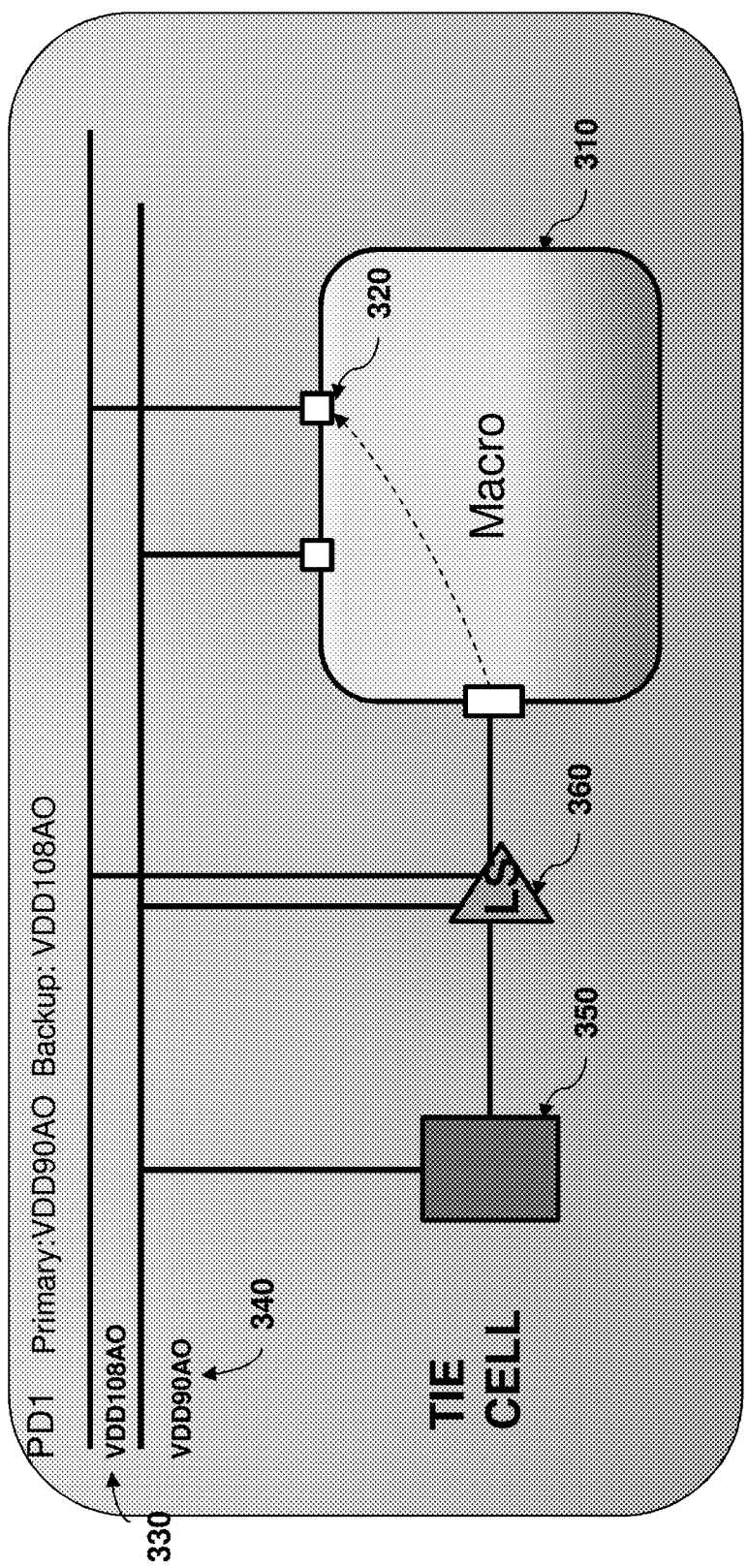
FIG. 3 illustrates a design comprising a macro and a prior art tie cell.
Figure 13:
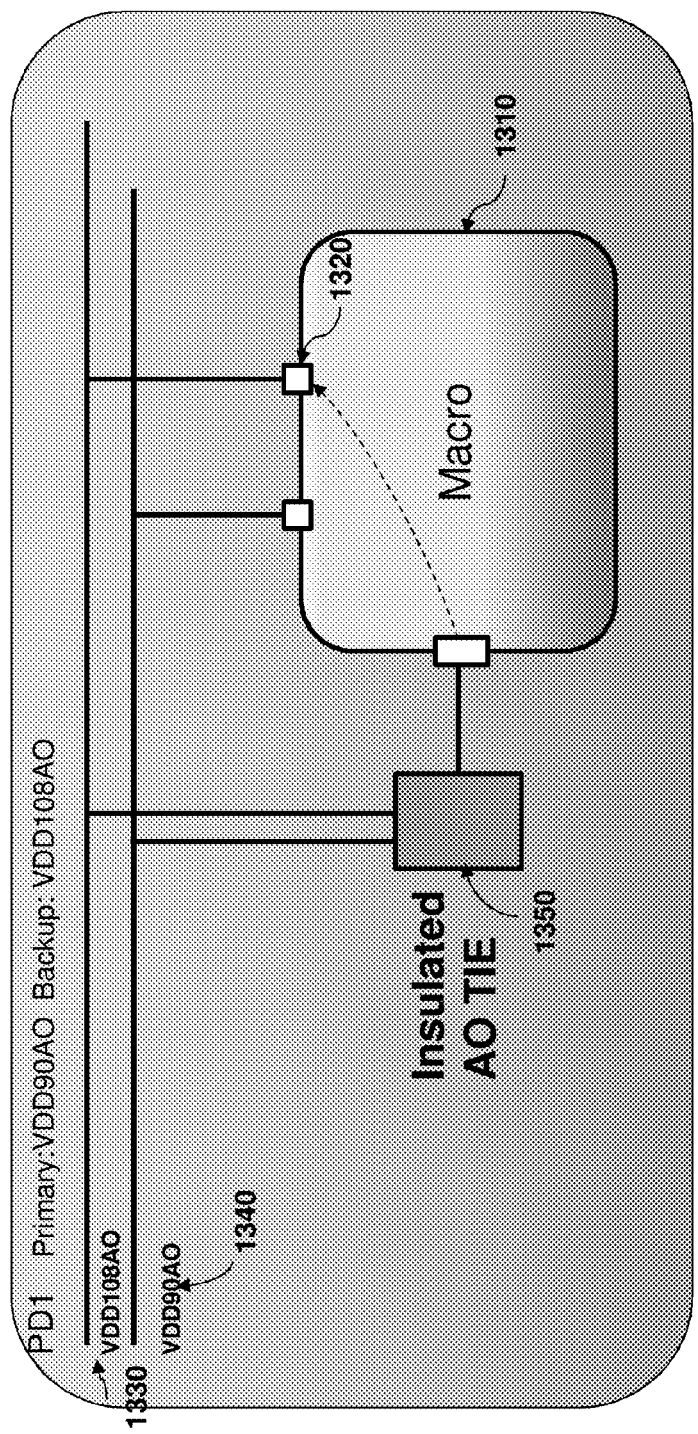
FIG. 13 illustrates an exemplary design using an exemplary insulated AO tie cell, according to embodiments of the present disclosure.

FIG. 13 illustrates the case in which the load supply 1330 (VDD108AO) has a different voltage level than primary supply 1340 (VDD90AO). In accordance with embodiments of the present disclosure, the use of an insulated AO tie cell 1350 eliminates the need for an extra level shifter cell to resolve the voltage difference between pin 1320 of macro 1310 and the AO tie cell 1350. It will be appreciated that this is in contrast to the depiction in FIG. 3 (wherein an additional level shifter cell is required to resolve the voltage difference between a pin of the macro and the normal or prior art tie cell).

Figure 14:
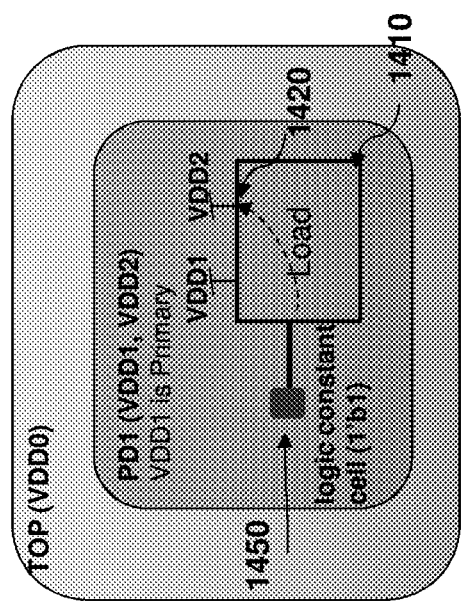
FIG. 14 illustrates an exemplary design using an exemplary AO tie cell, according to embodiments of the present disclosure.

FIG. 14 illustrates a configuration in which a tie cell, or an AO tie cell (insulated or non-insulated) 1450, is selected to implement the constant logic. In FIG. 14, the logic constant 1450 drives a load pin 1420. The primary supply of the load cell 1410 is VDD1 and the related supply of the load pin is VDD2.

To simplify the description, the following symbolic relationships are used herein:

"VDD1==VDD2" represents when VDD1's voltage is equal to VDD2's voltage;

"VDD1<VDD2" represents when VDD1's voltage is lower than VDD2's voltage;

"VDD1>VDD2" represents when VDD1's voltage is higher than VDD2's voltage; and

"VDD1 p>=VDD2" represents that the power state of VDD1 remains on longer than VDD2 or stays on equally as long as VDD2.

VDD1 is referred to herein as being able to drive VDD2 if the following two conditions are met:
 1. VDD1 p>=VDD2; and
 2. VDD1>VDD2 or VDD1==VDD2.

An over-driven condition occurs if VDD1 can drive VDD2 but the voltage difference is too large.

Figure 15:
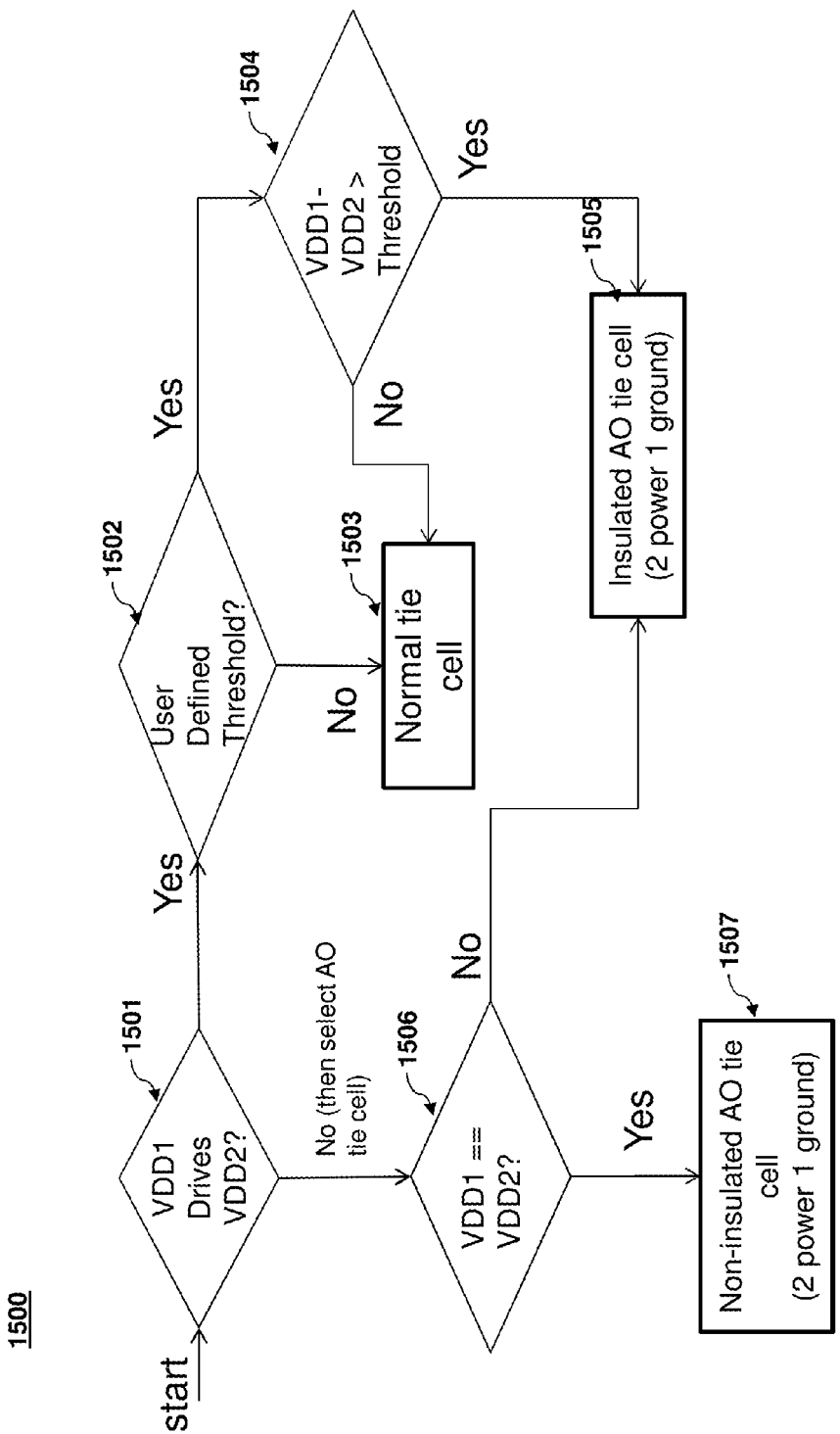
FIG. 15 illustrates an exemplary selection process for a normal (or prior art) or AO tie-high cell (insulated or non-insulated), according to embodiments of the present disclosure.

FIG. 15 illustrates an exemplary process 1500 for deciding whether to select a normal or AO tie-high cell, and if an AO tie-high cell is selected, whether to select an insulated or non-insulated AO tie-high cell, in accordance with embodiments of the present disclosure.

If VDD1 can drive VDD2 1501, then a normal tie cell is selected 1503. However, a user can define an over-driven threshold 1502. If the user has defined such a threshold, and the difference between the voltage of VDD1 and VDD2 is larger than the threshold (i.e., VDD1−VDD2>threshold) 1504, an insulated AO tie cell is selected 1505.

In the situation where VDD1 cannot drive VDD2 1501, an AO tie cell is selected. If VDD1 has the same voltage level as VDD2 1506, then a non-insulated AO tie cell is selected 1507. Otherwise, an insulated AO tie cell is selected 1505.

Figure 16:
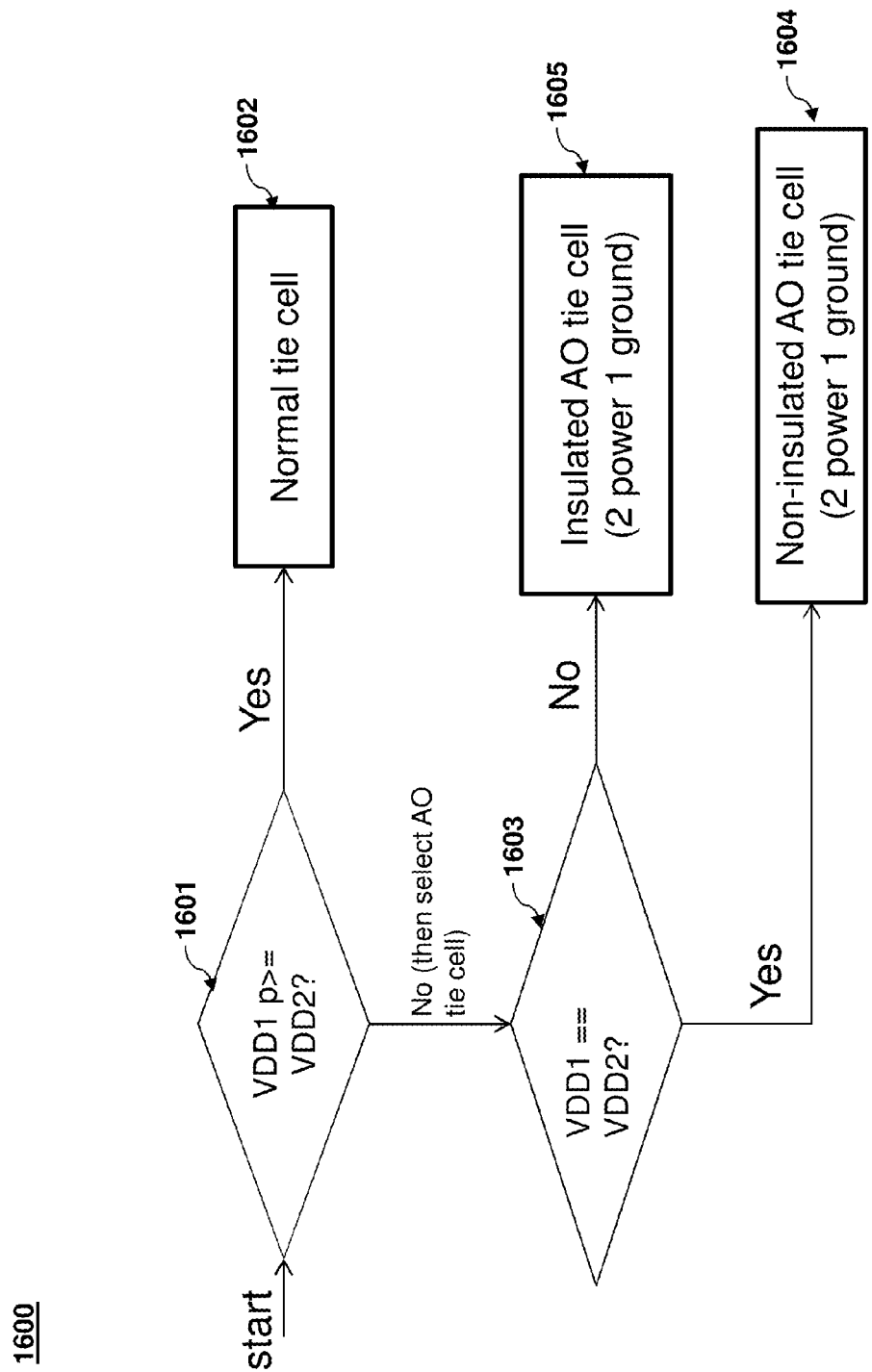
FIG. 16 illustrates an exemplary selection process for a normal (or prior art) or AO tie-low cell (insulated or non-insulated), according to embodiments of the present disclosure.

FIG. 16 illustrates an exemplary process 1600 for deciding whether to select normal (or prior art) or AO tie low cell. In the case of tie-low cells, an over-driven case is not an issue because the output of the tie-low cell has the same voltage as ground (VSS) in common ground (header power gating) design. Whether VDD1 is voltage drivable for VDD2 is also not an issue in this case.

Power gating is a technique used in integrated circuit design to reduce power consumption, by shutting off the current to blocks of the circuit that are not in use. Power gating reduces stand-by or leakage power. Power gating affects design architecture more than clock gating. It increases time delays, as power gated modes have to be safely entered and exited. Power gating uses low-leakage PMOS transistors as header switches to shut off power supplies to parts of a design in standby or sleep mode. NMOS footer switches can also be used as sleep transistors. Inserting the sleep transistors splits the chip's power network into a permanent power network connected to the power supply and a virtual power network that drives the cells and can be turned off. The power gate size must be selected to handle the amount of switching current at any given time. The gate must be bigger such that there is no measurable voltage (IR) drop due to the gate. As a rule of thumb, the gate size is selected to be around 3 times the switching capacitance. Designers can also choose between header (P-MOS) or footer (N-MOS) gate. Usually footer gates tend to be smaller in area for the same switching current. Dynamic power analysis tools can accurately measure the switching current and also predict the size for the power gate.

If the power state of VDD1 remains on longer than VDD2 or stays on equally as long as VDD2 1601, a normal or prior art tie cell is selected 1602. If the power state of VDD1 does not remain on longer than VDD2 nor stay on equally as long as VDD2 1601, an AO tie cell is selected. If VDD1 has the same voltage level as VDD2 1603, then a non-insulated AO tie cell is selected 1604. Otherwise, an insulated AO tie cell is selected 1605.

A power switch is used to implement power gating in a low power design, according to embodiments of the present disclosure. A header type and footer type power switch are used. The header power switch can shut off power supplies to parts of a design in standby or sleep mode but it will not control ground supplies. Contrariwise, the footer power switch controls ground supplies to control design in standby or sleep mode.

According to embodiments of the present disclosure, the low power circuit can have multiple power supplies with different power states and voltages but should have one common ground supply. This is true in a circuit that uses header power gating. However, for a generic circuit that uses footer power gating or mixture power gating, the circuit can also have multiple ground supplies that have different power states.

For a design that has multiple ground supplies, the following assumption can be made: For ground supplies, even if not common/equivalent, the voltage should be the same, which applies to header/footer power gating design.

Supply net pair {VDD1, VSS1} is referred to herein as being able to drive supply net pair {VDD2, VS52} if the following three conditions are met:
1. VDD1 p>=VDD2; and
2. VDD1>VDD2 or VDD1==VDD2; and
3. VSS1 p>=VSS2

Figure 17:
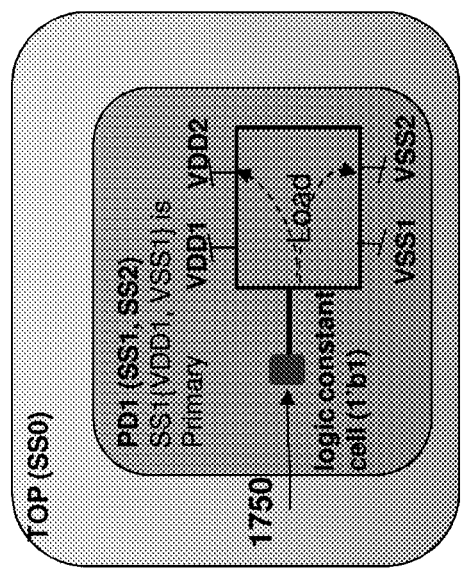
FIG. 17 illustrates an exemplary selection process in which a tie cell, or an AO tie cell (insulated or non-insulated), is selected to implement the constant logic in a design that has multiple power supplies and multiple ground supplies, according to embodiments of the present disclosure.

FIG. 17 illustrates an exemplary design in which a tie cell 1750, or an AO tie cell (insulated or non-insulated), is selected to implement the constant logic in a design that has multiple power supplies and multiple ground supplies. In FIG. 17, the source supply pair is {VDD1, VSS1} and the sink supply pair is {VDD2, VSS2}. The AO tie cell 1750 mentioned here may have backup power net and can also have backup ground net.

Figure 18:
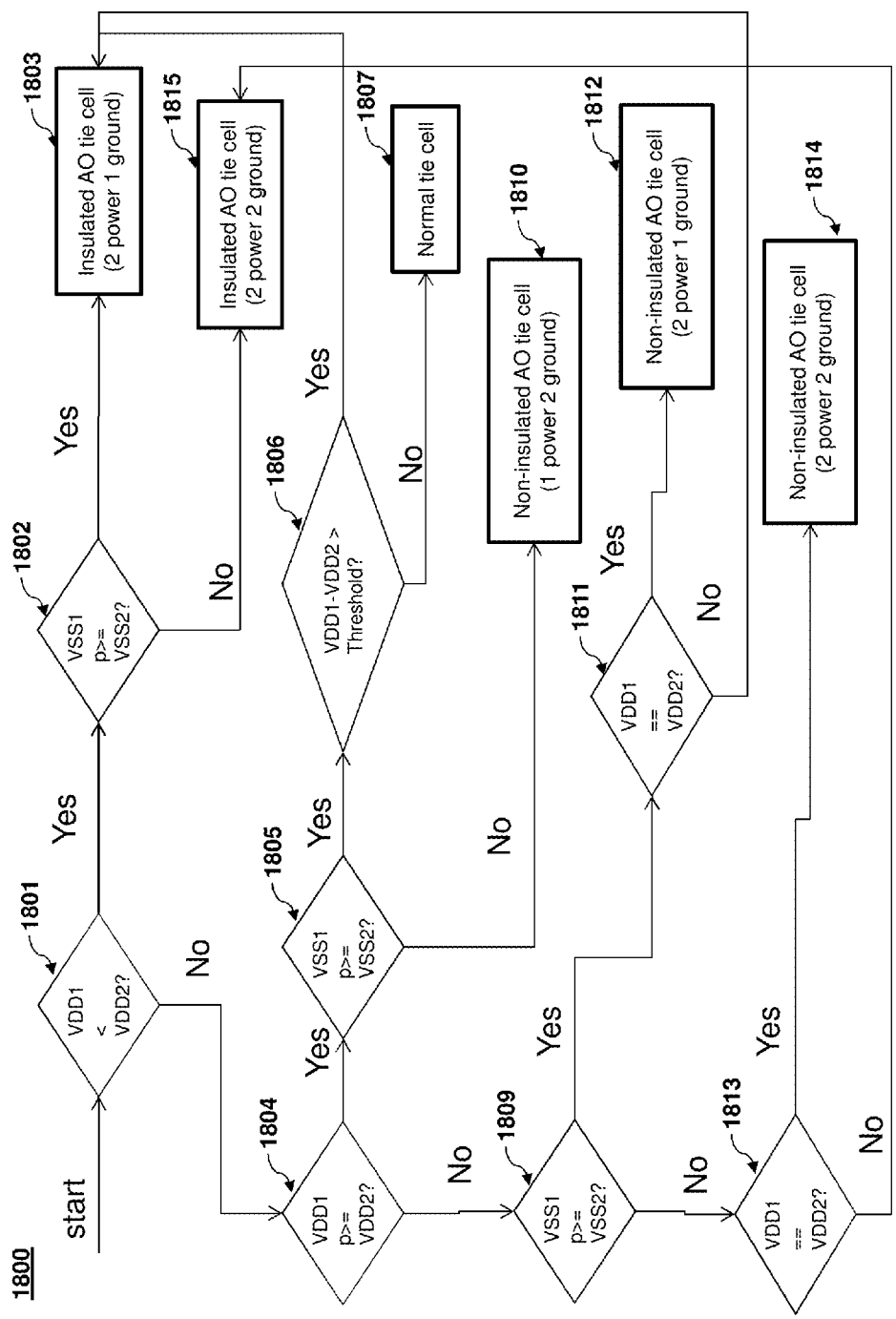
FIG. 18 illustrates a process for using an AO tie high cell for constant logic '1' in accordance with the process depicted in FIG. 17.

FIG. 18 illustrates an exemplary process 1800 for selection of a tie high cell for constant logic '1' in accordance with the design depicted in FIG. 17. If a voltage level of VDD1 is less than a voltage level of VDD2 1801, and a power level of VSS1 stays on equal to or longer than that of VSS2 1802, then an insulated AO tie cell is selected 1803 (2 power, 1 ground). If the power level of VSS1 does not stay on equal to or longer than that of VSS2 1802, then an insulated AO tie cell is selected 1815 (2 power, 2 ground).

If a voltage level of VDD1 is not less than a voltage level of VDD2 1801, and a power level of VDD1 stays on equal to or longer than that of VDD2 1804, then, if a power level of VSS1 stays on equal to or longer than that of VSS2 1805 and the difference VDD1−VDD2 is above a threshold 1806, then an insulated AO tie cell is selected 1803 (2 power, 1 ground), otherwise a normal tie cell is selected 1807. If a power level of VSS1 does not stay on equal to or longer than that of VSS2 1805, then a non-insulated AO tie cell is selected 1810 (1 power, 2 ground).

If a voltage level of VDD1 is not less than a voltage level of VDD2 1801, a power level of VDD1 does not stay on equal to or longer than that of VDD2 1804, then, if a power level of VSS1 stays on equal to or longer than that of VSS2 1809 and VDD1==VDD2 1811, then a non-insulated AO tie cell is selected 1812 (2 power, 1 ground), otherwise an insulated AO tie cell is selected 1803 (2 power, 1 ground).

If a voltage level of VDD1 is not less than a voltage level of VDD2 1801, a power level of VDD1 does not stay on equal to or longer than that of VDD2 1804, then, if a power level of VSS1 does not stay on equal to or longer than that of VSS2 1809 and VDD1==VDD2 1811, then a non-insulated AO tie cell is selected 1814 (2 power, 2 ground), otherwise an insulated AO tie cell is selected 1815 (2 power, 2 ground).

Figure 19:
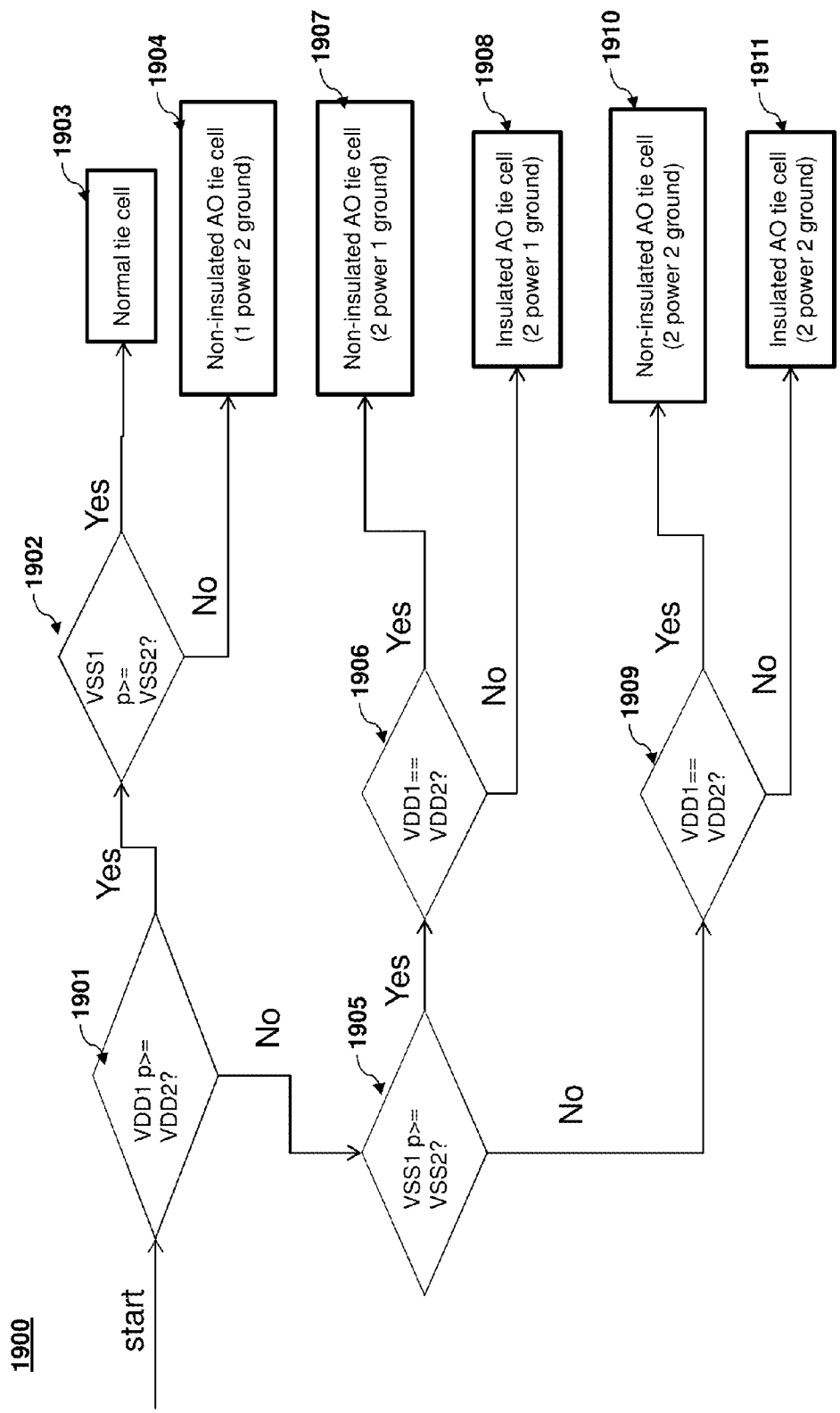
FIG. 19 illustrates a process for using an AO tie low cell for constant logic '0' in accordance with the process depicted in FIG. 17.

FIG. 19 illustrates an exemplary process 1900 selection of a tie low cell for constant logic '0' in accordance with the design depicted in FIG. 17. If a power level of VDD1 stays on equal to or longer than that of VDD2 1901, and a power level of VSS1 stays on equal to or longer than that of VSS2 1902, then a normal tie cell is selected 1903. If a power level of VDD1 stays on equal to or longer than that of VDD2 1901, and a power level of VSS1 does not stay on equal to or longer than that of VSS2 1902, a non-insulated AO tie cell is selected (1 power, 2 ground).

If a power level of VDD1 does not stay on equal to or longer than that of VDD2 1901, and a power level of VSS1 stays on equal to or longer than that of VSS2 1905, then, if VDD1==VDD2, a non-insulated AO tie cell is selected (2 power, 1 ground) 1907.

If a power level of VDD1 does not stay on equal to or longer than that of VDD2 1901, and a power level of VSS1 stays on equal to or longer than that of VSS2 1905, then, if VDD1 does not ==VDD2, an insulated AO tie cell is selected (2 power, 1 ground) 1908.

If a power level of VDD1 does not stay on equal to or longer than that of VDD2 1901, and a power level of VSS1 does not stay on equal to or longer than that of VSS2 1902, then, if VDD1==VDD2, a non-insulated AO tie cell is selected 1910 (2 power, 2 ground), otherwise an insulated AO tie cell is selected 1911 (2 power, 2 ground).

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:
1. A computer-implemented method, comprising:
    determining a relationship between a primary power supply and a backup load supply;
    selecting a cell, based on the relationship, from a group consisting of a tie cell, an insulated always-on (AO) tie-high cell, an insulated always-on (AO) tie-low cell, a non-insulated AO tie-high cell, and a non-insulated AO tie-low cell, wherein the cell generates one of a logic '0' or a logic '1' for an IC design; and
    placing the cell in the IC design.
2. The method of claim 1, wherein a tie-high cell is selected to implement logic '1' when the primary power supply can drive the backup load power supply for an IC design that uses header power gating.

3. The method of claim 1, wherein an insulated AO tie-high cell is selected to implement logic '1' when the primary power supply can drive the backup load power supply, and when a voltage difference between the primary power supply and the backup load power supply exceeds an over-driven threshold for an IC design that uses header power gating.

4. The method of claim 1, wherein an insulated AO tie-high cell is selected to implement logic '1' when the primary power supply cannot drive the backup load power supply and there is a voltage difference between the primary power supply and the backup load power supply for an IC design that uses header power gating.

5. The method of claim 1, wherein a non-insulated AO tie-high cell is selected to implement logic '1' when the primary power supply cannot drive the backup load power supply and the primary power supply has same voltage as the backup load power supply for an IC design that uses header power gating.

6. The method of claim 1, wherein a tie-low cell is selected to implement logic '0' when the primary power supply can drive the backup load power supply on power state for an IC design that uses header power gating.

7. The method of claim 1, wherein an insulated AO tie-low cell is selected to implement logic '0' when the primary power supply cannot drive the backup load power supply on power state and there is a voltage difference between the primary power supply and the backup load power supply for an IC design that uses header power gating.

8. The method of claim 1, wherein a non-insulated AO tie-low cell is selected to implement logic '0' when the primary power supply cannot drive the backup load power supply on power state and the primary power supply has a same voltage as the backup load power supply for an IC design that uses header power gating.

9. The method of claim 1, wherein a tie-high cell is selected to implement logic '1' when both the primary power and ground supply can drive the backup load power and ground supply for an IC design that uses mixture header and footer power gating.

10. The method of claim 1, wherein an insulated AO tie-high cell is selected to implement logic '1' when the primary power supply can drive the backup power supply, and when a voltage difference between the primary power supply and the backup load power supply exceeds an over-driven threshold for an IC design that uses mixture header and footer power gating.

11. The method of claim 1, wherein an insulated AO tie-high cell is selected to implement logic '1' when a primary power supply/ground supply pair cannot drive the backup load power supply/ground supply pair and there is a voltage difference between the primary power supply and the backup load power supply for an IC design that uses mixture header and footer power gating.

12. The method of claim 10 or 11, wherein an insulated AO tie-high cell without backup ground supply is selected when the primary ground supply can drive the load ground supply.

13. The method of claim 10 or 11, wherein an insulated AO tie-high cell with backup ground supply is selected when the primary ground supply cannot drive the load ground supply.

14. The method of claim 1, wherein a non-insulated AO tie-high cell is selected to implement logic '1' when the primary power/ground supply pair cannot drive the backup load power/ground supply pair the primary power supply has same voltage as the backup load power supply for an IC design that uses mixture header and footer power gating.

15. The method of claim 14, wherein a non-insulated AO tie-high cell without backup power supply but with backup ground supply is selected if the primary power supply can drive the load power supply but primary ground supply cannot drive the load ground supply.

16. The method of claim 14, wherein a non-insulated AO tie-high cell with backup power supply but without backup ground supply is selected if primary power supply cannot drive load power supply on power state but primary ground supply can drive the load ground supply.

17. The method of claim 14, wherein a non-insulated AO tie-high cell with both backup power and ground supply is selected if primary power supply cannot drive load power supply on power state and primary ground supply cannot drive the load ground supply.

18. The method of claim 1, wherein a tie-low cell is selected to implement logic '0' when both the primary power and ground supply can drive the load power and ground supply on power state for an IC design that uses mixture header and footer power gating.

19. The method of claim 1, wherein an insulated AO tie-low cell is selected to implement logic '0' when the primary power/ground supply pair cannot drive the backup load power/ground supply pair on power state and there is a voltage difference between the primary power supply and the backup load power supply for an IC design that uses mixture header and footer power gating.

20. The method of claim 19, wherein an insulated AO tie-low cell with backup load power supply but without backup ground supply is selected if primary power supply cannot drive load power supply on power state but primary ground supply can drive load ground supply.

21. The method of claim 19, wherein an insulated AO tie-low cell with backup power and backup ground supply is selected if primary power supply cannot drive load power supply on power state and primary ground supply cannot drive the load ground supply.

22. The method of claim 1, wherein a non-insulated AO tie-low cell is selected to implement logic '0' when the primary power supply cannot drive the backup load power supply on power state and the primary power supply has a same voltage as the backup load power supply for an IC design that uses mixture header and footer power gating.

23. The method of claim 1, wherein a non-insulated AO tie-low cell with backup ground supply but without backup power supply is selected to implement logic '0' when the primary power supply can drive the backup load power supply on power state but primary ground supply cannot drive the backup load ground supply for an IC design that uses mixture header and footer power gating.

24. The method of claim 22, wherein a non-insulated AO tie-low cell with backup power but without backup ground supply is selected when primary power supply cannot drive backup load power supply but primary ground supply can drive backup ground supply.

25. The method of claim 22, wherein a non-insulated AO tie-low cell with backup power and ground supply is selected when primary power supply cannot drive backup load power supply and primary ground supply cannot drive backup ground supply.

26. The method of claim 1, wherein the IC design includes bias support.

27. The method of claim 1, wherein the IC design does not include bias support.

28. The method of claim 3 or 11, wherein the over-driven threshold is user configurable.

* * * * *